(12) United States Patent
Miyagi et al.

(10) Patent No.: US 6,498,376 B1
(45) Date of Patent: Dec. 24, 2002

(54) SEMICONDUCTOR DEVICE AND MANUFACTURING METHOD THEREOF

(75) Inventors: Masanori Miyagi, Chiba (JP); Haruo Konishi, Chiba (JP); Kazuaki Kubo, Chiba (JP); Yoshikazu Kojima, Chiba (JP); Toru Shimizu, Chiba (JP); Yutaka Saitoh, Chiba (JP); Toru Machida, Chiba (JP); Tetsuya Kaneko, Chiba (JP)

(73) Assignee: Seiko Instruments INC (JP)

( * ) Notice: Subject to any disclaimer, the term of this patent is extended or adjusted under 35 U.S.C. 154(b) by 0 days.

(21) Appl. No.: 08/459,831

(22) Filed: Jun. 2, 1995

(30) Foreign Application Priority Data

| Jun. 3, 1994 | (JP) | ............................................. 6-122872 |
| Feb. 1, 1995 | (JP) | ............................................. 7-015419 |
| Feb. 1, 1995 | (JP) | ............................................. 7-015421 |
| Apr. 21, 1995 | (JP) | ............................................. 7-097227 |
| May 11, 1995 | (JP) | ............................................. 7-113447 |

(51) Int. Cl.$^7$ ..................... H01L 29/76; H01L 29/94; H01L 31/062; H01L 31/113

(52) U.S. Cl. ..................... 257/392; 257/391; 257/404

(58) Field of Search ................................ 257/288, 296, 257/298, 368, 371, 391, 392, 401, 404

(56) References Cited

U.S. PATENT DOCUMENTS

| 4,395,725 A | * | 7/1983 | Parebh ..................... 357/23 |
| 4,514,894 A | * | 5/1985 | Kawagoe .................. 29/571 |
| 5,315,547 A | * | 5/1994 | Shoji et al. ................ 365/185 |
| 5,422,510 A | * | 6/1995 | Scharf et al. .............. 257/401 |

FOREIGN PATENT DOCUMENTS

| JP | 2109370 | * | 4/1990 | .................. 257/409 |
| JP | 3218070 | * | 9/1991 | .................. 257/404 |

* cited by examiner

Primary Examiner—Phat X. Cao
Assistant Examiner—Howard Weiss
(74) Attorney, Agent, or Firm—Adams & Wilks

(57) ABSTRACT

A MISFET is provided with a segmented channel comprising regions in which the channel is inverted by a first gate voltage and regions in which the channel is inverted by a second gate voltage. The MISFET is formed in a semiconductor substrate having a first conductivity type and the first inversion region of the channel has a first impurity concentration determined by the surface concentration of the substrate. The second inversion region of the channel has a second impurity concentration determined by doping an impurity to the region selected by a photolithographic process. The first and second inversion regions may be divided into a plurality of plane shapes and the threshold voltage of the MISFET is set to a desired value in accordance with the plane area ratio of the first and second inversion regions.

28 Claims, 39 Drawing Sheets

F I G. 3
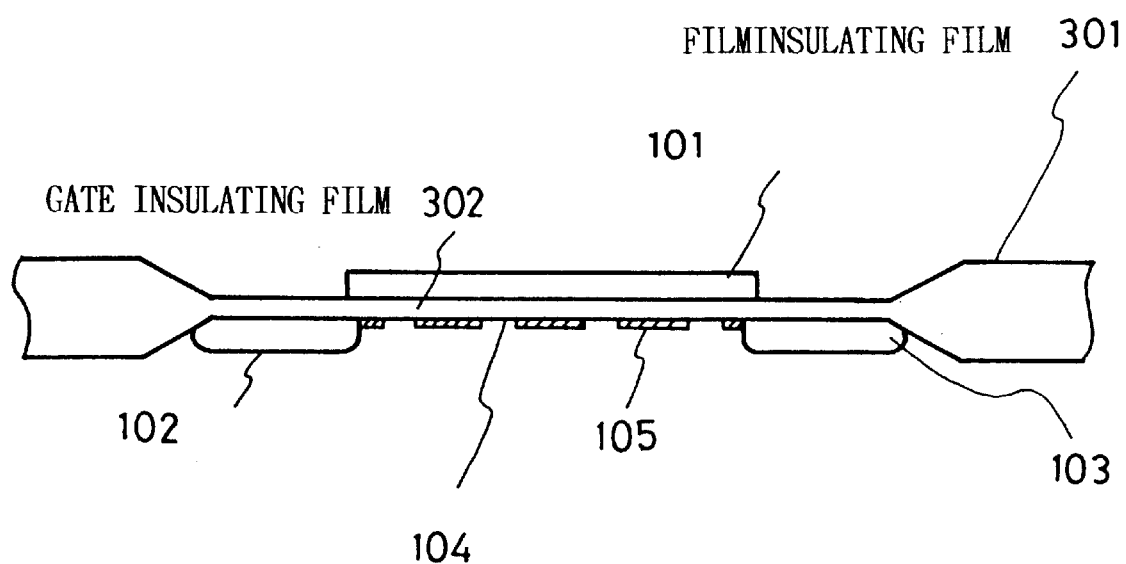

Fig. 6

| | Transistor type | Channel Width (W) | Channel Length (L) | Mask Pattern and Size for Impurity Doping | | | Area Ratio of Second Impurity Region | Note |
|---|---|---|---|---|---|---|---|---|
| | | | | Pattern | Width | Gap | | |
| Tr-1 | Depletion Type NMOS | 50 μm | 50 μm | Strips Parallel to Channel Length | 1.0 μm | 1.0 μm | 0.500 | |
| Tr-2 | Depletion Type NMOS | 50 μm | 50 μm | Strips Parallel to Channel Length | 2.0 μm | 1.0 μm | 0.660 | |
| Tr-3 | Depletion Type NMOS | 50 μm | 50 μm | Strips Parallel to Channel Length | 1.0 μm | 2.0 μm | 0.340 | |
| Tr-4 | Depletion Type NMOS | 50 μm | 50 μm | Strips Parallel to Channel Length | 2.0 μm | 2.0 μm | 0.520 | |
| Tr-5 | Depletion Type NMOS | 50 μm | 50 μm | Strips Parallel to Channel Length | 4.0 μm | 1.0 μm | 0.800 | |
| Tr-6 | Depletion Type NMOS | 50 μm | 50 μm | Strips Parallel to Channel Length | 1.0 μm | 4.0 μm | 0.200 | |
| Tr-7 | Depletion Type NMOS | 50 μm | 50 μm | Strips Parallel to Channel Length | 4.0 μm | 4.0 μm | 0.520 | |
| Tr-8 | Depletion Type NMOS | 50 μm | 50 μm | Strips Parallel to Channel Length | 12.5 μm | 25.0 μm | 0.500 | *1 |
| Tr-9 | Depletion Type NMOS | 50 μm | 50 μm | Strips Parallel to Channel Width | 1.0 μm | 1.0 μm | 0.500 | |
| Tr-10 | Depletion Type NMOS | 50 μm | 50 μm | Strips Parallel to Channel Width | 2.0 μm | 1.0 μm | 0.660 | |
| Tr-11 | Depletion Type NMOS | 50 μm | 50 μm | Strips Parallel to Channel Width | 1.0 μm | 2.0 μm | 0.340 | |
| Tr-12 | Depletion Type NMOS | 50 μm | 50 μm | Strips Parallel to Channel Width | 2.0 μm | 2.0 μm | 0.520 | |
| Tr-13 | Depletion Type NMOS | 50 μm | 50 μm | Strips Parallel to Channel Width | 4.0 μm | 1.0 μm | 0.800 | |
| Tr-14 | Depletion Type NMOS | 50 μm | 50 μm | Strips Parallel to Channel Width | 1.0 μm | 4.0 μm | 0.200 | |
| Tr-15 | Depletion Type NMOS | 50 μm | 50 μm | Strips Parallel to Channel Width | 4.0 μm | 4.0 μm | 0.520 | |
| Tr-16 | Depletion Type NMOS | 50 μm | 50 μm | Strips Parallel to Channel Width | 12.5 μm | 25.0 μm | 0.500 | *1 |
| Tr-17 | Depletion Type NMOS | 50 μm | 50 μm | Dots Pattern | 1.0 μm | 1.0 μm | 0.250 | |
| Tr-18 | Depletion Type NMOS | 50 μm | 50 μm | Dots Pattern | 2.0 μm | 1.0 μm | 0.444 | |
| Tr-19 | Depletion Type NMOS | 50 μm | 50 μm | Dots Pattern | 1.0 μm | 2.0 μm | 0.116 | |
| Tr-20 | Depletion Type NMOS | 50 μm | 50 μm | Dots Pattern | 2.0 μm | 2.0 μm | 0.270 | |
| Tr-21 | Depletion Type NMOS | 50 μm | 50 μm | Dots Pattern | 4.0 μm | 1.0 μm | 0.640 | |
| Tr-22 | Depletion Type NMOS | 50 μm | 50 μm | Dots Pattern | 1.0 μm | 4.0 μm | 0.040 | |
| Tr-23 | Depletion Type NMOS | 50 μm | 50 μm | Dots Pattern | 4.0 μm | 4.0 μm | 0.270 | |

*1) Width=12.5 μm × 2   Gap=25.0 μm × 1

Fig. 7

| | Transistor type | Channel Width (W) | Channel Length (L) | Mask Pattern and Size for Impurity Doping | | | Area Ratio of Second Impurity Region | Note |
|---|---|---|---|---|---|---|---|---|
| | | | | Pattern | Width | Gap | | |
| Tr-24 | Enhancement Type NMOS | 50 μm | 50 μm | Strips Parallel to Channel Length | 1.0 μm | 1.0 μm | 0.500 | |
| Tr-25 | Enhancement Type NMOS | 50 μm | 50 μm | Strips Parallel to Channel Length | 2.0 μm | 1.0 μm | 0.660 | |
| Tr-26 | Enhancement Type NMOS | 50 μm | 50 μm | Strips Parallel to Channel Length | 1.0 μm | 2.0 μm | 0.340 | |
| Tr-27 | Enhancement Type NMOS | 50 μm | 50 μm | Strips Parallel to Channel Length | 2.0 μm | 2.0 μm | 0.520 | |
| Tr-28 | Enhancement Type NMOS | 50 μm | 50 μm | Strips Parallel to Channel Length | 4.0 μm | 1.0 μm | 0.800 | |
| Tr-29 | Enhancement Type NMOS | 50 μm | 50 μm | Strips Parallel to Channel Length | 1.0 μm | 4.0 μm | 0.200 | |
| Tr-30 | Enhancement Type NMOS | 50 μm | 50 μm | Strips Parallel to Channel Length | 4.0 μm | 4.0 μm | 0.520 | |
| Tr-31 | Enhancement Type NMOS | 50 μm | 50 μm | Strips Parallel to Channel Length | 12.5 μm | 25.0 μm | 0.500 | *1 |
| Tr-32 | Enhancement Type NMOS | 50 μm | 50 μm | Strips Parallel to Channel Width | 1.0 μm | 1.0 μm | 0.500 | |
| Tr-33 | Enhancement Type NMOS | 50 μm | 50 μm | Strips Parallel to Channel Width | 2.0 μm | 1.0 μm | 0.660 | |
| Tr-34 | Enhancement Type NMOS | 50 μm | 50 μm | Strips Parallel to Channel Width | 1.0 μm | 2.0 μm | 0.340 | |
| Tr-35 | Enhancement Type NMOS | 50 μm | 50 μm | Strips Parallel to Channel Width | 2.0 μm | 2.0 μm | 0.520 | |
| Tr-36 | Enhancement Type NMOS | 50 μm | 50 μm | Strips Parallel to Channel Width | 4.0 μm | 1.0 μm | 0.800 | |
| Tr-37 | Enhancement Type NMOS | 50 μm | 50 μm | Strips Parallel to Channel Width | 1.0 μm | 4.0 μm | 0.200 | |
| Tr-38 | Enhancement Type NMOS | 50 μm | 50 μm | Strips Parallel to Channel Width | 4.0 μm | 4.0 μm | 0.520 | |
| Tr-39 | Enhancement Type NMOS | 50 μm | 50 μm | Strips Parallel to Channel Width | 12.5 μm | 25.0 μm | 0.500 | *1 |
| Tr-40 | Enhancement Type NMOS | 50 μm | 50 μm | Dots Pattern | 1.0 μm | 1.0 μm | 0.250 | |
| Tr-41 | Enhancement Type NMOS | 50 μm | 50 μm | Dots Pattern | 2.0 μm | 1.0 μm | 0.444 | |
| Tr-42 | Enhancement Type NMOS | 50 μm | 50 μm | Dots Pattern | 1.0 μm | 2.0 μm | 0.116 | |
| Tr-43 | Enhancement Type NMOS | 50 μm | 50 μm | Dots Pattern | 2.0 μm | 2.0 μm | 0.270 | |
| Tr-44 | Enhancement Type NMOS | 50 μm | 50 μm | Dots Pattern | 4.0 μm | 1.0 μm | 0.640 | |
| Tr-45 | Enhancement Type NMOS | 50 μm | 50 μm | Dots Pattern | 1.0 μm | 4.0 μm | 0.040 | |
| Tr-46 | Enhancement Type NMOS | 50 μm | 50 μm | Dots Pattern | 4.0 μm | 4.0 μm | 0.270 | |

*1) Width=12.5 μm × 2  Gap=25.0 μm × 1

Fig. 8

| | Transistor type | Channel Width (W) | Channel Length (L) | Mask Pattern and Size for Impurity Doping | | | Area Ratio of Second Impurity Region |
|---|---|---|---|---|---|---|---|
| | | | | Pattern | Width | Gap | |
| Tr-47 | Depletion Type NMOS | 50 μm | 50 μm | Whole Channel Region | — | — | 1.000 |
| Tr-48 | Enhancement Type NMOS | 50 μm | 50 μm | Whole Channel Region | — | — | 1.000 |
| Tr-49 | Zero Threshold Type NMOS | 50 μm | 50 μm | None (Native State) | — | — | 0.000 |

AREA RATIO OF SECOND IMPURITY CONCCENTRATION REGION
(SECOND IMPURITY REGION / TOTAL CHANNEL REGION)

AREA RATIO OF SECOND IMPURITY CONCCENTRATION REGION
(SECOND IMPURITY REGION / TOTAL CHANNEL REGION)

AREA RATIO OF SECOND IMPURITY CONCCENTRATION REGION
(SECOND IMPURITY REGION / TOTAL CHANNEL REGION)

AREA RATIO OF SECOND IMPURITY CONCCENTRATION REGION (WIDTH OF ZERO THRESHOLD VOLTAGE REGION)

AREA RATIO OF SECOND IMPURITY CONCCENTRATION REGION
(SECOND IMPURITY REGION / TOTAL CHANNEL REGION)

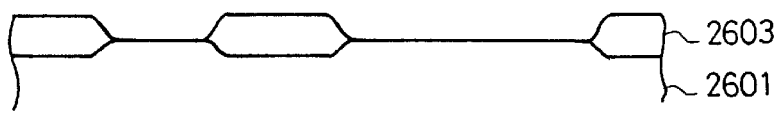
FIG. 27A
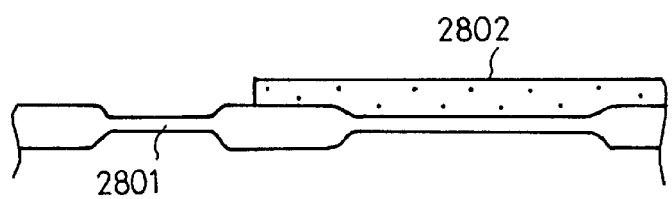
FIG. 27B
FIG. 27C
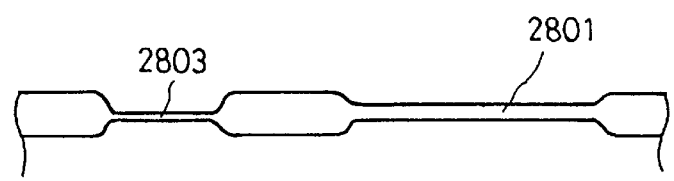
FIG. 27D
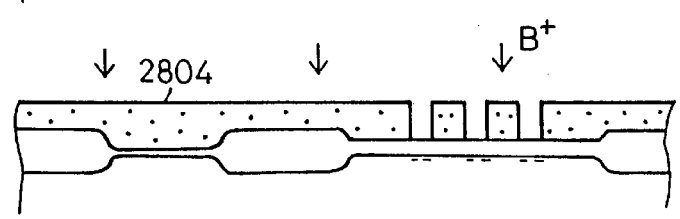
FIG. 27E
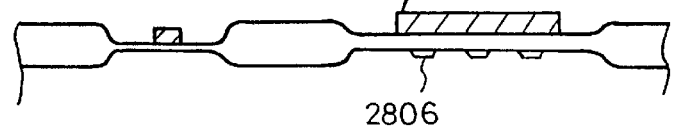

$M_0$ SIZE: W/L = 20 μm/5 μm
$M_{1\sim n}$ SIZE: W/L = 20 μm/6 μm
$C_{1\sim n}$ CAPACITANCE: C = 1.6pF THRESHOLD VOLTAGE
$V_{tM1} > V_{tM2} > V_{tM3} > \cdots > V_{tMn-1} > V_{tMn}$

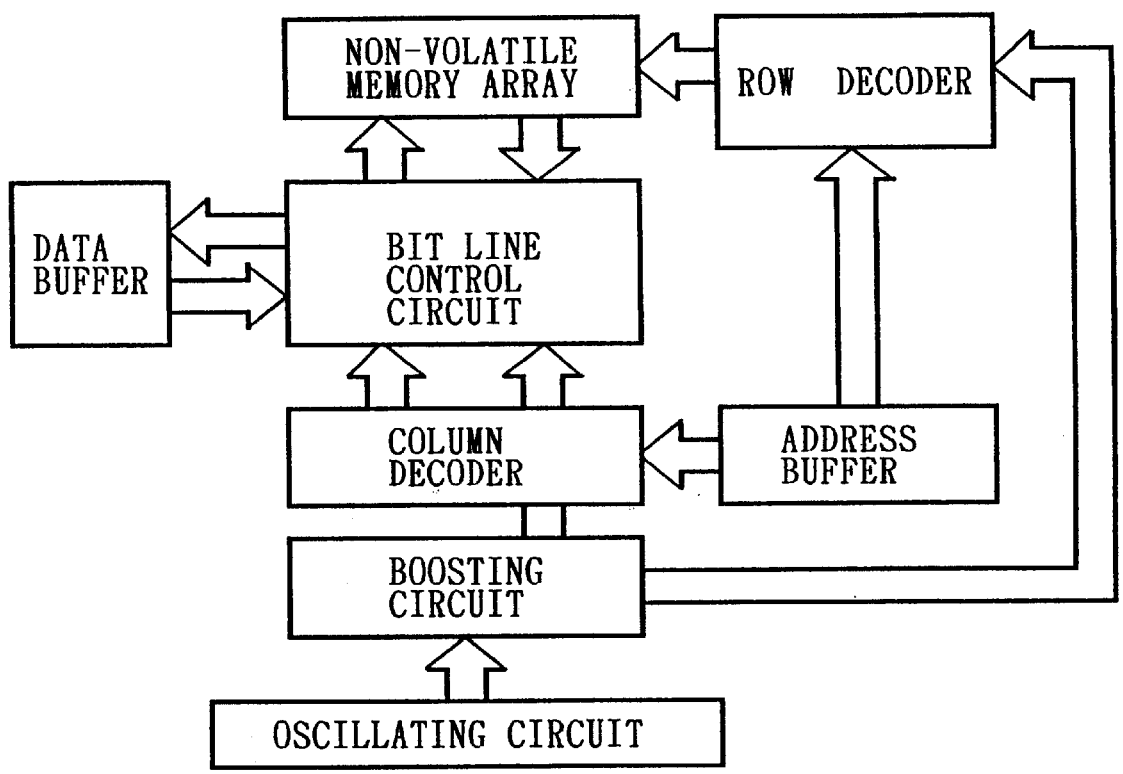
F I G. 3 6

SEMICONDUCTOR DEVICE AND MANUFACTURING METHOD THEREOF

BACKGROUND OF THE INVENTION

The present invention relates to a construction of a channel region of an insulating gate field effect transistor (hereinafter referred to as a MISFET) constituting a semiconductor device of an integrated circuit and more particularly to a semiconductor device in which a surface inversion voltage (threshold voltage) of the channel region which is determined by impurity concentrations and thicknesses of a gate insulating film of the channel region is controlled.

The present invention relates to a semiconductor device of an integrated circuit composed of MISFETs having a plurality of threshold voltages formed on the same substrate and to a manufacturing method thereof.

The present invention also relates to a semiconductor device of an integrated circuit having different conductive MISFETs on the same substrate and to a manufacturing method thereof.

The present invention further relates to a semiconductor device of an integrated circuit having high withstand voltage and low voltage MISFETs to which different gate voltages are applied on the same substrate and to a manufacturing method thereof.

The present invention furthermore relates to a semiconductor device comprising an analog circuit formed and a digital circuit on the same substrate and to a manufacturing method thereof.

The present invention relates additionaly to a semiconductor device formed on a thin film semiconductor provided on an insulating layer and to a manufacturing method thereof.

FIGS. 38A through 38C are schematic plan views representing MISFETs within a prior art semiconductor device of an integrated circuit.

Note that the explanation of the present specification is made exemplifying a MOSFET in which an insulating layer interposed between a metal gate electrode and a semiconductor substrate is a silicon oxide film, as a typical example of the MISFET.

FIGS. 38A to 38C schematically show a source, drain and gate of three kinds of transistors, and aluminum metallic wirings and other elements are omitted to simplify the description.

Transistors 1, 2 and 3 have each different threshold voltage ($V_{TH}$).

FIG. 39 is a schematic section view illustrating the MOSFET within the prior art semiconductor integrated circuit.

In the transistor 1, an impurity concentration of a channel region 4004 is set at a value of an impurity concentration of a semiconductor substrate 4006 and a threshold voltage determined by the impurity concentration of the channel region 4004 and a thickness of a gate insulating film 4005 is denoted as $V_{TH1}$.

When it is desired to differentiate a threshold voltage $V_{TH2}$ Of the second transistor 2 from $V_{TH1}$, a channel region 2 having an impurity concentration which is different from that of the channel region 1 of the transistor 1 is formed by optically patterning a photoresist by using a glass mask and others for selecting a region to which an impurity is doped (photolithographic technique) and by doping the impurity via the gate insulating film 4005 by ion implantation and others using the photoresist selectively formed as a mask.

At this time, a pattern 3905 of the glass mask 1 for ion implantation for selecting the region to which the impurity is doped is created so as to be slightly larger than the channel region to cover the whole surface thereof considering a dislocation of registration of the glass mask as shown in FIG. 38B and the photoresist is removed slightly more than the channel region to dope the impurity to the channel at the region where the photoresist is removed.

The gate insulating film 4005 is normally formed of a silicon oxide film having a homogeneous thickness from around 10 nm to 100 nm.

By constructing as described above, the transistor 2 having $V_{TH2}$ which is different from $V_{TH1}$ of the transistor 1 may be formed. In the same manner, a transistor having a necessary threshold voltage may be formed by doping a necessary impurity like $V_{TH3}$ of the transistor 3.

Further, although not shown in the figure, in a semiconductor device of an integrated circuit in which a high voltage MOSFET having a thick gate oxide film and a low voltage MOSFET having a thin gate oxide film are provided on the surface of the same substrate, a concentration of a homogeneous impurity region of channel region of each MOSFET is controlled by a photolithographic technique in order to equalize each threshold voltage to almost the same value.

Similarly, in a CMOS type integrated circuit comprising P-type and N-type MOSFETs, threshold voltages are equalized to almost the same value by separate impurity doping processes.

SUMMARY OF THE INVENTION

However, because the MOSFETs within the prior art semiconductor device of the integrated circuit have the channel region having the homogeneous impurity concentration and the gate insulating film having the uniform thickness as described above, the surface inversion voltage of the channel becomes constant and hence processes for doping a necessary number of types of impurities or impurity concentrations to the channel region have been necessary in order to form transistors having a plurality of types of threshold voltages within the semiconductor device of the integrated circuit formed on a single semiconductor substrate.

Accordingly, it has been costly and been a restriction in designing the circuit to form the transistors having the plurality of types of threshold voltages within the semiconductor device of the integrated circuit formed on single semiconductor substrate.

Further, a plural number of photolithographic processes have been necessary to adjust the threshold voltages matching with the range of the power supply voltage in the semiconductor device of the integrated circuit in which transistors having a structure in which threshold voltages differ before an impurity is doped to the channel region are provided on the same substrate. Accordingly, a manufacturing period has been prolonged and a manufacturing cost has been increased to manufacture the semiconductor device in which the threshold voltages of the MOSFETs having different gate insulating films, different substrate concentrations or different conductive types are controlled.

In order to solve the aforementioned problems, the present invention adopts the following means.

As first means, channel regions having different surface inversion voltages such that the channel surface is inverted by more than two different gate voltages are provided within the same channel of a MOSFET.

Further, plural types of ratios of plane areas of a first surface inversion voltage area and a second surface inversion voltage region or plural types of individual plane size or shape of the first surface inversion voltage region and the second surface inversion voltage region are provided.

As second means, the second surface inversion voltage region is divided into a plurality of plane shapes.

There are the following methods as examples of the method of dividing the region into the plurality of plane shapes:

1) divide in strips parallel to the direction of the channel length;
2) divide in strips parallel to the direction of the channel width;
3) divide in dots; and
4) divide in checker pattern.

As third means, the channel region having more than two different surface inversion voltages is obtained by forming regions having more than two different impurity concentrations (channel impurity region) on the surface of the same channel region of the MOSFET.

As fourth means, the channel impurity region described in the third means is formed to be shallower than a depth of junction of the source and drain regions.

As fifth means, a first MOSFET and a second MOSFET each having a gate insulating film formed with different thicknesses are formed and the first through fourth means described above are applied to each of them.

As sixth means, a first MOSFET is formed on a first conductive semiconductor substrate and a second MOSFET is formed within a well region having a different impurity concentration from that of the semiconductor substrate but formed in the same conductive type with that, and first through fourth means described above are applied to each.

As seventh means, a first MOSFET is formed on a first conductive semiconductor substrate and a second MOSFET is formed within a well region formed with a different conductive type from that of the semiconductor substrate, and first through fourth means described above are applied to each.

As eighth means, a MOSFET is formed on a thin film semiconductor whose thickness is thinner than 10m and which is formed on the insulating layer, and the first through fourth means described above are applied to the MOSFET.

As ninth means, the thickness of the thin film semiconductor layer described in the eighth means is equalized to a thickness of a channel region of the MOSFET formed on the thin film semiconductor layer.

As tenth means, the thickness of the thin film semiconductor layer described in the eighth means is equalized to a depth of a channel impurity region of the channel region of the MOSFET formed on the thin film semiconductor layer.

As 11-th means, a semiconductor device is provided in which a first conductive impurity is doped without using a photoresist pattern as a mask in doping the impurity in an enhancement type MOSFET channel region and then a second conductive impurity is doped only to a channel region of a depletion type MOSFET by using the photoresist as a mask so that a peak thereof comes to a position within ±20 nm from a peak position of the first conductive impurity profile.

As 12-th means, a semiconductor device is provided in the semiconductor device in the 11-th means described above in which a photoresist is formed selectively and partially on the depletion type MOSFET channel region and then the second conductive impurity is doped only to the channel region of the depletion type MOSFET by using the photoresist as a mask so that a peak thereof comes to a position within ±20 nm from a peak position of the first conductive impurity profile.

As 13-th means, a manufacturing method of a semiconductor device is taken, comprising steps of:

forming a field insulating film on the surface of a first conductive semiconductor region on the surface of a substrate;

forming a gate insulating film on the surface of a first transistor region and second transistor region of the semiconductor region;

forming a photoresist pattern for forming a channel impurity region on the surface of the first transistor region;

forming the channel impurity region by doping an impurity on the surface of the first transistor region by using the resist pattern as a mask;

patterning a gate electrode on the gate insulating film;

forming a second conductive source and drain regions on the surface of the first transistor region so that they are partitioned by the gate electrode;

forming an intermediate insulating film on the gate electrode;

forming contact holes through the intermediate insulating film; and patterning metallic wirings so as to be overlaid on the contact holes;

at least a plurality of first impurity concentration regions and second impurity concentration regions being divided and formed in plane between the source region and the drain region in the channel impurity forming region.

As 14-th means, a manufacturing method of the semiconductor device wherein the first impurity concentration region and second impurity concentration region are formed by selectively doping an impurity for controlling threshold voltage within the same channel by forming the photoresist in a desired shape on the region to be formed as the channel is taken.

As 15-th means, a manufacturing method of the semiconductor device wherein the first impurity concentration region and second impurity concentration region are formed by selectively doping an impurity for controlling threshold voltage within the same channel by ion implantation by forming the photoresist in a desired shape on the region to be formed as the channel is taken.

As 16-th means, a manufacturing method of the semiconductor device is taken, comprising steps of forming a first gate insulating film on the first transistor region and forming a second gate insulating film having a thickness different from that of the first gate insulating film on the second transistor region, and in which the 13-th to 15-th means described above are applied to each of the first transistor region and the second transistor region.

As 17-th means, a manufacturing method of the semiconductor device is taken, comprising steps of forming a second conductive well region on the surface of the first conductive semiconductor region containing the source and drain regions of the first transistor region, doping a first conductive impurity as the source and drain regions of the first transistor region and doping a second conductive impurity as the source and drain regions of the second transistor region, and in which the 13-th to 15-th means described above are applied to each of the first transistor region and the second transistor region.

As 18-th means, a manufacturing method of a semiconductor device is taken in which a first conductive impurity is doped without using a photoresist pattern as a mask in doping the impurity in an enhancement type MOSFET channel region and then a second conductive impurity is doped only to a channel region of a depletion type MOSFET by using the photoresist as a mask so that a peak thereof comes to a position within ±20 nm from a peak position of the first conductive impurity profile.

As 19-th means, a manufacturing method of a semiconductor device is taken in the semiconductor device in the 18-th means described above in which a photoresist is formed selectively and partially on the depletion type MOSFET channel region and then the second conductive impurity is doped only to the channel region of the depletion type MOSFET by using the photoresist as a mask so that a peak thereof comes to a position within ±20 nm from a peak position of the first conductive impurity profile.

As 20-th means, the channel region having more than two different surface inversion voltages is obtained by forming a gate insulating film having more than two different thicknesses on the same channel region of the MOSFET.

As 21-st means, a manufacturing method of a semiconductor device is taken, comprising steps of:
  forming a field insulating film on the surface of a first conductive semiconductor region on the surface of a substrate;
  forming a photoresist for selecting a region for forming a gate insulating film having different thicknesses on the surface of a first transistor region and second transistor region of the semiconductor region;
  forming the gate insulating film having different thicknesses in response to the shape of the photoresist;
  forming a channel impurity region on the surface of the first and second transistor regions;
  patterning a gate electrode on the gate insulating film;
  forming second conductive source and drain regions on the surface of the first transistor region so that they are partitioned by the gate electrode;
  forming an intermediate insulating film on the gate electrode;
  forming contact holes through the intermediate insulating film; and
  patterning metallic wirings so as to be overlaid on the contact holes;
the gate insulating film being divided to form at least a plurality of regions of gate insulating film having the first thickness and the second thickness in plane between the source and drain regions on the same channel.

As 22-nd means, a manufacturing method of the semiconductor device wherein the gate insulating film having more than two different thicknesses is formed by forming a photoresist selectively on the same channel and by selectively removing or forming the gate insulating film by using the photoresist selectively formed as a mask is taken.

As 23-rd means, a semiconductor device is provided wherein an analog circuit comprising the MISFET described in the first through 12-th means and 20-th means and a digital circuit comprising a second MISFET having a second channel region whose region is smaller than the channel region of the MOSFET used in the analog circuit by more than one digit are provided on the surface of the semiconductor substrate.

As 24-th means, a plurality of the MISFETs described in the first through 12-th means and the 20-th means are diode-connected in series to construct a voltage boosting circuit (charge pump circuit) in which a capacitor for storing charges is connected to each of the MISFETs and the area ratio or shape of the second surface inversion voltage region is changed as along the steps of the voltage boosting circuit from the previous ones to the rear ones.

The voltage boosting circuit is mounted in the semiconductor device of the integrated circuit having a non-volatile semiconductor memory device.

As 25-th means, the MOSFET described in the first to 12-th means and the 20-th means is used in a differential amplifier circuit.

As 26-th means, the MOSFET described in the first to 12-th means and the 20-th means is used in a reference voltage generating circuit for generating a constant voltage which becomes a criterion for comparing voltages in the differential amplifier circuit.

As 27-th means, the differential amplifier circuit described in 25-th means is connected to the reference voltage generating circuit described in the 26-th means and to an output circuit for generating an output a voltage to construct a semiconductor device of an integrated circuit which always outputs a constant output voltage even if a load of the output is changed by comparing a voltage generated in the reference voltage generating circuit with the voltage outputted to the outside of the output circuit or a voltage which follows the voltage outputted to the outside with a predetermined ratio by the differential amplifier circuit.

A threshold voltage $V_{TH}$ of the insulating gate field effect transistor (MISFET) may be represented by the following equation:

$$V_{TH} = \Phi_{MS} + \frac{Q_B}{C_{OX}} + 2\Phi_f \tag{1}$$

where, $\Phi_{MS}$ is a difference in work function between the substrate and the gate electrode, $Q_B$ is a depletion charge amount per unit area generating in the channel region, $C_{OX}$ is a capacitance per unit area of the gate insulating film and $\Phi_f$ is the Fermi level of the substrate.

The whole threshold voltage $V_{TH}$ when a plurality of areas having threshold voltages which differ locally, i.e. surface inversion voltages $V_{T1}$ and $V_{T2}$, are provided within the channel region is represented by the following equation:

$$V_{TH} = AV_{T1} + BV_{T2} \tag{2}$$

A and B are constants of $0 \leq A$ and $B \leq 1$ and depend on the shape of pattern of each area.

Accordingly, the areas having the plural threshold voltages may be formed on the same substrate by one set of photolithography by controlling the constants A and B by the photolithographic technique. However, $V_{TH}$ is always set between each local threshold voltages, like $V_{T1} \leq V_{TH} \leq V_{T2}$. The local threshold voltage is a threshold voltage which does not depend on the channel size when the channel region is formed with a homogeneous impurity concentration (a transistor having a very large size) and is a value derived mathematically from Equation (1).

Further, a target threshold voltage may be achieved by one set of photolithography steps in a MOS transistor having different gate insulating film capacitance (or thicknesses and types of gate insulating films), substrate concentrations or $\Phi_{MS}$ by patterning locally different impurity regions on the channel region.

That is, when the different impurity regions are patterned, the threshold voltage is approximated by the following equation:

$$V_{TH} = \Phi_{MS} + \alpha \cdot \frac{Q_{B1}}{C_{OX}} + \beta \cdot \frac{Q_{B2}}{C_{OX}} + 2\Phi_f \quad (3)$$

Alpha and beta are constants of $0 \leq \alpha+\beta \leq 1$. $Q_{B1}$ and $Q_{B2}$ are depletion charge amounts per unit area in the direction of channel depth along the direction of depth of the substrate from the surface of the channel region of each different impurity region. $\Phi_{MS}$ and $\Phi_f$ are effective values which can be found substantially by experiments because a plural types of impurity concentrations and plural areas exist in the channel region.

By Equation (3), threshold voltages may be controlled to almost the same value by one kind of photolithography in each transistor having different gate insulating films for example by patterning the impurity in the channel region.

Furthermore, threshold voltages may be controlled to almost the same value toward the enhancement side by the similar means in both N-type and P-type MISFETs provided on the same substrate.

While Equation (1) shows that the threshold voltage will change even when a capacitance per unit area of the gate insulating film is changed, it also shows that the threshold voltage will change similarly also when plural types of plural areas in which thicknesses of the gate insulating film differ exist within one channel even when the impurity concentration of the channel region is constant.

The threshold voltage at this time may be approximated by the following equation:

$$V_{TH} = \Phi_{MS} + \alpha \cdot \frac{Q_B}{C_{OX1}} + \beta \cdot \frac{Q_B}{C_{OX2}} + 2\Phi_f \quad (4)$$

Alpha and beta are constants of $0 \leq \alpha+\beta \leq 1$, similarly to Equation (3). $Q_B$ is a depletion charge amount per unit area in the direction of channel depth along the direction of depth of the substrate from the surface of the channel region. $C_{OX1}$, and $C_{OX2}$ are values of capacitance per unit area of the gate insulating film having locally different thicknesses.

The operations of the present invention will be shown below along the items described in Means for Solving the Problems.

By taking the first means, a transistor having a plurality of threshold voltages may be obtained within the same semiconductor device of an integrated circuit.

Thereby, a degree of freedom in designing the circuit is increased and a very high performance and high function semiconductor integrated circuit device may be realized at low cost.

By taking the second means, a transistor having such good characteristics in that there is no kink and less leak current may be obtained as aimed at in relatively high accuracy. It also allows one to obtain better characteristics by dividing finely within a range permitted by fine processing.

By taking the third and fourth means, a transistor having a plurality of threshold voltages may be readily obtained by one time of channel impurity doping process.

Heretofore, although only two types of transistors in which an impurity is doped to the whole channel region and in which no impurity is doped at all are created as for the threshold voltages of the MOSFET formed on the same conductive semiconductor substrate region or well region in controlling the threshold voltages of the MOSFET by a channel impurity doping process comprising one time of photoresist optical patterning process and ion implantation process for example, a transistor having at least three types of threshold voltages may be formed by taking the third and fourth means because the threshold voltage of the transistor in which the impurity is doped partially to the channel region is distributed between the threshold voltage of the transistor in which the impurity is doped to the whole channel region and that of the transistor in which no impurity is doped.

Further, a transistor having more than three types of threshold voltages may be readily formed by adequately selecting an area ratio and shape of the area to which the impurity is doped.

By taking the fifth means, transistors in which the threshold voltages are equal or are adjusted to desired values, respectively, may be readily obtained even if the thickness of the gate insulating film differ by one time of channel impurity doping process.

By taking the sixth means, transistors in which the threshold voltages are equal or are adjusted to desired values, respectively, may be readily obtained even if they are formed in the same conductive region having different impurity concentrations of the substrate or well by one time of channel impurity doping process.

By taking the seventh means, transistors in which the threshold voltages are equal or are adjusted to desired values, respectively, may be readily obtained even if they are formed on different conductive substrates or well regions by one time of channel impurity doping process.

By taking the eighth, ninth and tenth means, a plurality of transistors having different threshold voltages may be readily obtained by one time of channel impurity doping process in transistors formed on a thin film semiconductor layer on an insulating layer.

When the thickness of the thin film semiconductor layer is sufficiently thin and is equal to the thickness of the channel region of the transistor or to the depth by which the channel impurity is doped, transistors having better characteristics may be obtained because the channel impurity partially doped fully diffuses, approaching to a more homogeneous concentration as a whole.

By taking the 11-th means, one process of the optical patterning processes of the photoresist may be omitted.

By taking the 12-th means, one process of the optical patterning processes of the photoresist may be omitted and the MOSFET having more than three types of desired threshold voltages from enhancement type to depletion type may be formed by one time of photoresist optical patterning process and two times of impurity doping processes.

By taking the 13-th through 17-th means, the MOSFET described in the third through tenth means and a semiconductor integrated circuit device carrying the MOSFET described above may be easily manufactured without adding a special process, as compared to the prior art method.

By taking the 18-th means, a semiconductor device may be manufactured without degrading the characteristics of the MOSFET even if one process of the photoresist optical patterning processes is omitted.

By taking the 19-th means, one process of the optical patterning processes of the photoresist may be omitted and a MOSFET having more than three types of desired threshold voltages from enhancement type to depletion type may be formed by one time of photoresist optical patterning process and two times of impurity doping processes.

By taking the 20-th means, a MOSFET having a plurality of threshold voltages may be readily obtained just by adding one process for forming a gate insulating film having a second thickness.

Further, a MOSFET having a plurality of threshold voltages may be readily obtained without adding new process when there has been a process for forming the gate insulating film having the second thickness such as a tunnel insulating film like a semiconductor device of an integrated circuit carrying a FLOTOX type non-volatile memory.

By taking the 21-st and 22-nd means, the MOSFET described in the 20-th means and a semiconductor device of an integrated circuit carrying the MOSFET may be easily manufactured.

By taking the 23-rd means, a high performance analog circuit having a large degree of freedom may be structured for a transistor of the analog circuit having relatively large channel region by forming the channel impurity region into an adequate shape and size, and the analog circuit and a digital circuit may be carried on the same substrate at low cost.

By taking the 24-th means, a very efficient voltage boosting circuit may be structured because a voltage drop caused by an increase of threshold voltage due to a substrate effect in a plurality of MOSFETs connected in series (MOS diode) may be reduced.

Further, a low cost and high performance semiconductor device of an integrated circuit may be realized when the voltage boosting circuit in the 24-th means is mounted on the semiconductor integrated circuit device having a non-volatile memory function because a circuit having the same boosting ability may be constructed with a circuit having less area or a circuit having a high boosting ability may be constructed by a circuit having the same area.

By taking the 25-th, 26-th and 27-th means, a low cost semiconductor device of an integrated circuit may be realized because the separate processes for doping impurities to form a MOSFET having a plurality of threshold voltages in the prior art may be realized by one process. The detailed explanation thereof is given in the following Detailed Description of Preferred Embodiments.

BRIEF DESCRIPTION OF THE DRAWINGS

FIG. 3 is a schematic section view of the MOSFET according to the second embodiment of the present invention;

FIG. 6 is an explanatory chart showing concrete sizes and types of each section of the depletion type MOSFETs of the first through third embodiments of the present invention;

FIG. 7 is an explanatory chart showing concrete sizes and types of each section of the enhancement type MOSFETs of the first through third embodiments of the present invention;

FIG. 8 is an explanatory chart showing concrete sizes and types of each section of the prior art MOSFETs to compare with the characteristics of the MOSFETs of the first through third embodiments of the present invention;

FIG. 27 is a section view sequentially showing processes for manufacturing the IC including the high withstanding MOSFET of the seventh embodiment of the present invention;

FIG. 36 is a block diagram showing a non-volatile semiconductor memory device mounted with the voltage boosting circuit in the fourteenth embodiment according to a fifteenth embodiment of the present invention;

DETAILED DESCRIPTION OF THE PREFERRED EMBODIMENTS

Preferred embodiments of the present invention will be explained below with reference to the drawings.

Figure 1:
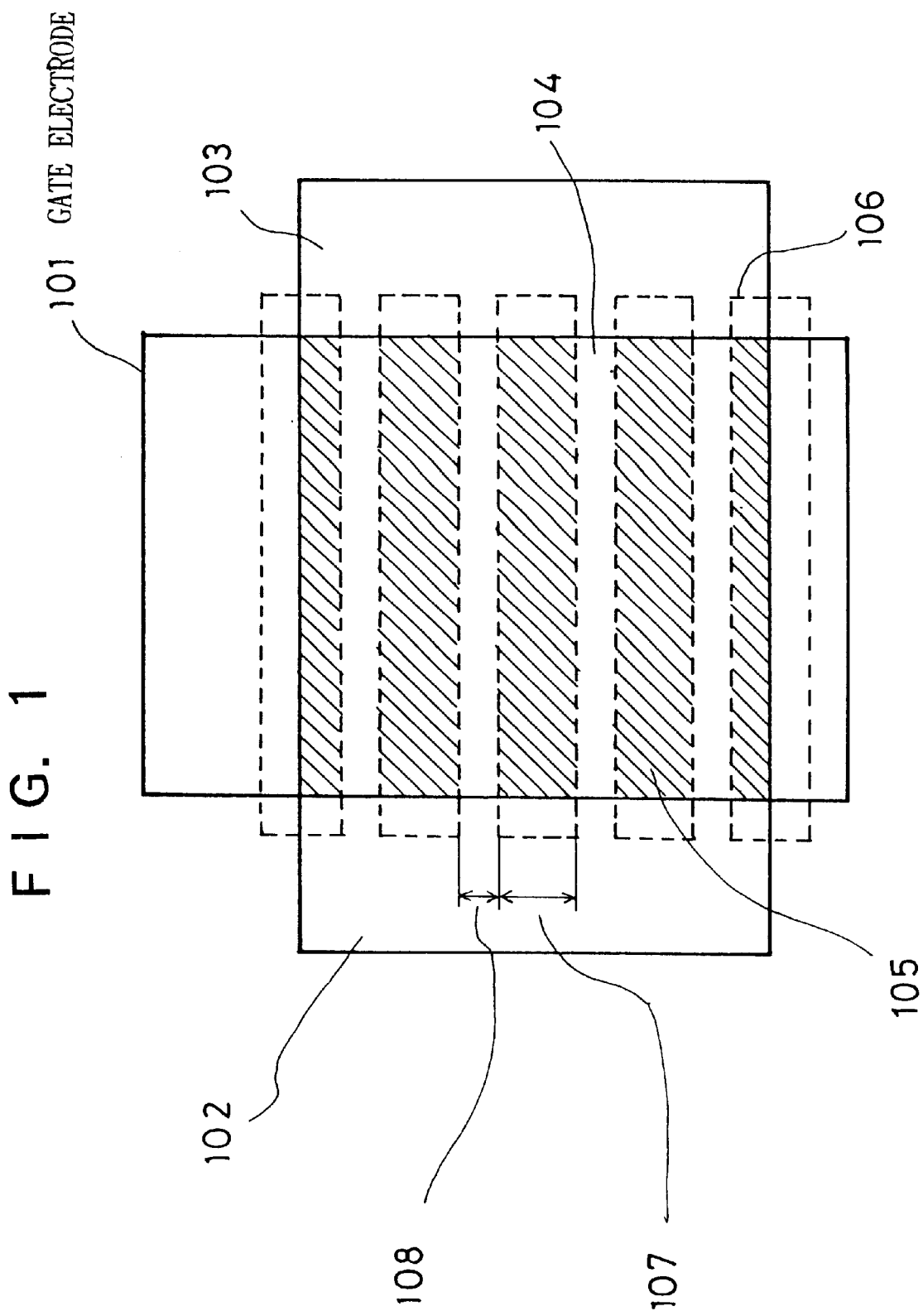
FIG. 1 is a schematic plan view of a MOSFET according to a first embodiment of the present invention.

FIG. 1 is a schematic plan view of a MOSFET according to a first embodiment of the present invention.

If the MOSFET of the first embodiment is an N-type MOSFET formed on a P-type semiconductor substrate, while an impurity concentration of channel regions 104 having a first impurity concentration is determined by the P-type semiconductor substrate and an impurity concentration of channel regions 105 having a second impurity concentration is determined by doping of an impurity by means of ion implantation to a region selected by a photoresist optically patterned by patterns 106 for doping impurity, the impurity doped to form the channel regions having the second impurity concentration is doped in strips in the direction parallel to the channel length of the transistor since the patterns 106 for doping impurity are drawn in strips in the direction parallel to the channel length of the transistor.

As a result, the channel regions 104 having the first impurity concentration and the channel regions 105 having the second impurity concentration are formed respectively in strips in the direction parallel to the channel length.

An area ratio of the channel regions having the second impurity concentration to the whole channel region may be predetermined to a desired value by combining a width 107 of the mask pattern for doping impurity and a gap 108 between the mask patterns for doping impurity. The sizes of the width 107 of the mask pattern for doping impurity and the gap 108 therebetween may differ even if the area ratio is the same.

The region having the second impurity concentration is formed generally in a channel doping process. Profile of the impurity changes by a heat treatment thereafter. However, it is formed so that a depth thereof is shallower than at least a depth of junction of a source region 102 and a drain region 103. A control accuracy of the threshold voltage may be increased by forming the region having the second impurity concentration so that the depth thereof is shallower than a depth of a depletion layer generated on the surface of the substrate when an electric field is applied to the gate electrode.

Figure 2:
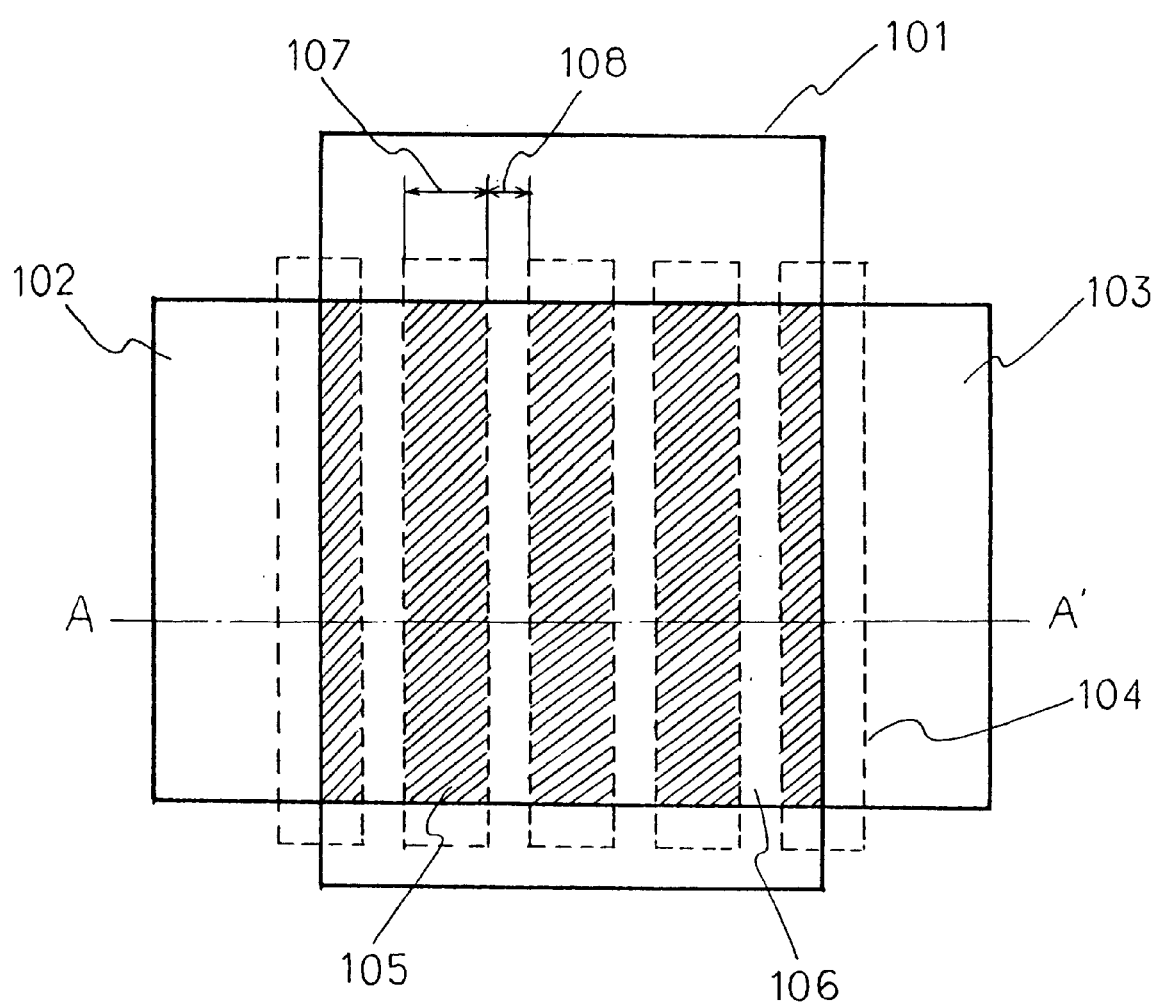
FIG. 2 is a schematic plan view of a MOSFET according to a second embodiment of the present invention.

FIG. 2 is a schematic plan view of a MOSFET according to a second embodiment of the present invention.

Although patterns for doping impurity 106 are drawn in strips similarly to the first embodiment, they are strips in the direction parallel to the channel width in the second embodiment. A desirable area ratio is determined by combining the width 107 of the mask pattern for doping impurity and the gap 108 between the mask patterns for doping impurity and the sizes of the 107 of the mask pattern for doping impurity and the gap 108 may differ even when the area ratio is the same also in the second embodiment.

FIG. 3 is a schematic section view showing a section A–A' right after when a channel impurity has been doped in the MOSFET of the second embodiment of the present invention.

Figure 4:
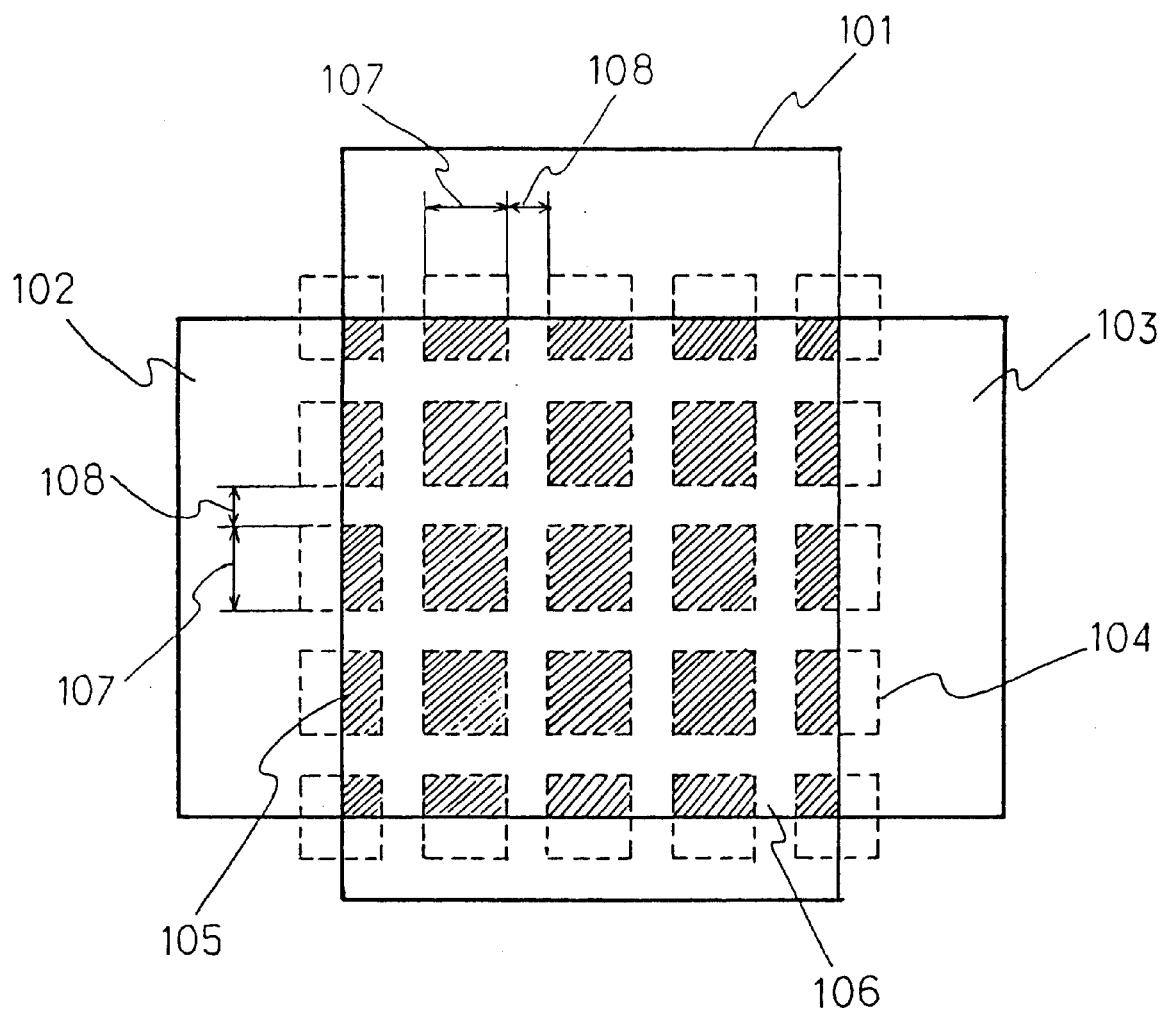
FIG. 4 is a schematic plan view of a MOSFET according to a third embodiment of the present invention.

FIG. 4 is a schematic plan view of a MOSFET according to a third embodiment of the present invention.

In the third embodiment, patterns 106 of masks for doping impurity are drawn in dots. A desirable area ratio of the channel regions having the second impurity concentration is determined similarly to the first and second embodiments and the sizes of the 107 of the mask pattern for doping impurity and the gap 108 may differ even when the area ratio is the same also in the third embodiment.

Figure 5:
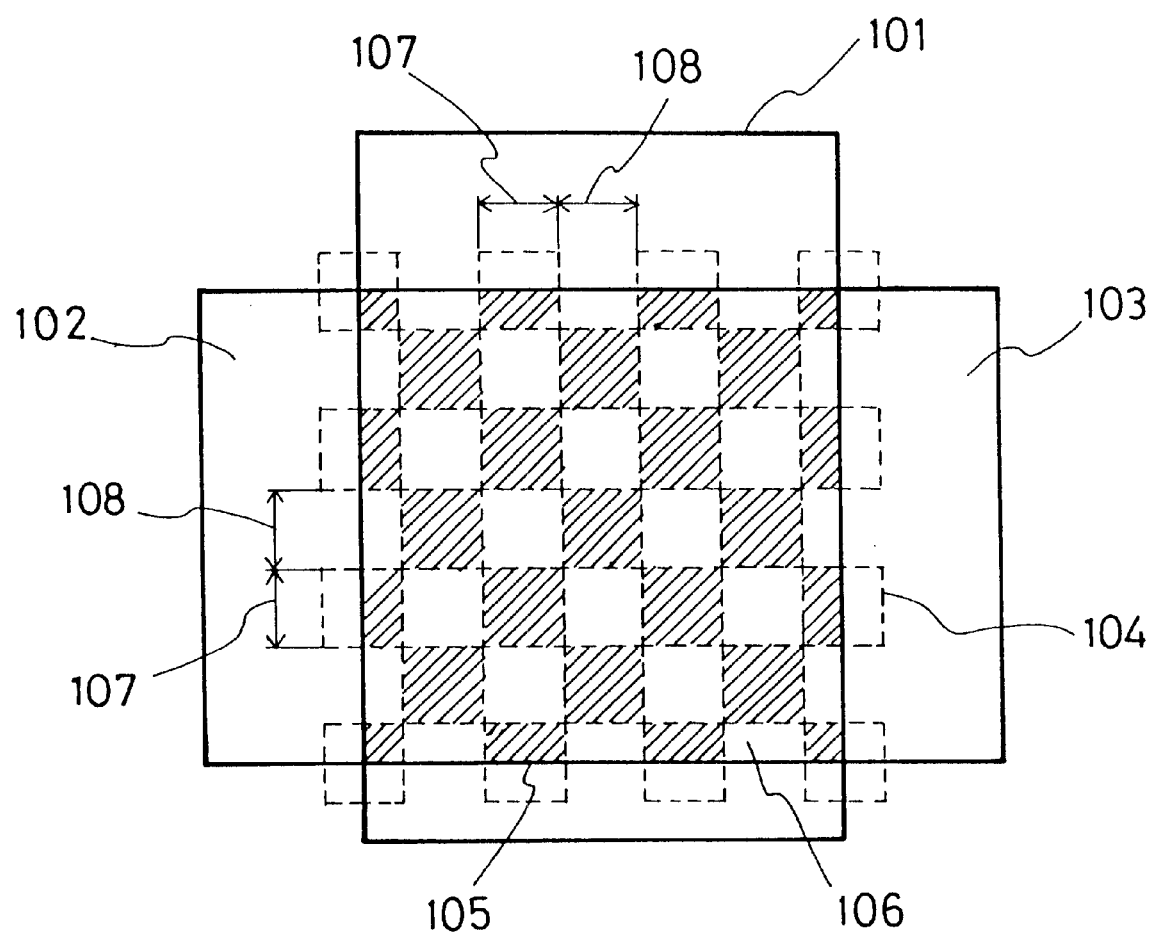
FIG. 5 is a schematic plan view of a MOSFET according to a fourth embodiment of the present invention.

FIG. 5 is a schematic plan view of a MOSFET according to a fourth embodiment of the present invention.

In the fourth embodiment, patterns 106 of masks for doping impurity are drawn in checker pattern. An area ratio of the channel regions having the second impurity concentration is determined similarly to the first and second embodiments and the sizes of the 107 of the mask pattern for doping impurity and the gap 108 may differ even when the area ratio is the same also in the fourth embodiment.

FIGS. 6 and 7 are explanatory charts listing types, concrete sizes of each section and area ratios of the area having the second impurity concentration to the whole channel region of the MOSFETs of the first through third embodiments of the present invention.

FIG. 8 is an explanatory chart listing types and sizes of the prior art MOSFETs for comparison.

Transistors Tr1 through Tr8 and Tr24 through Tr31 are related to the first embodiment, transistors Tr9 through Tr16 and Tr32 through Tr39 are related to the second embodiment and transistors Tr17 through Tr23 and Tr40 through Tr46 are related to the third embodiment.

Among them, MOSFETs shown in FIG. 6 are what the regions having the second impurity concentration form depletion type channels and MOSFETs shown in FIG. 7 are what the areas having the second impurity concentration form enhancement type channels.

The areas having the first impurity concentration of the MOSFETs listed in Charts 6 and 7 are in a native state which is determined by a concentration of the P-type semiconductor substrate and zero threshold type channels are formed in the present embodiment.

FIG. 8 lists sizes and other physical characteristics of the prior art MOSFETs of the depletion type (Tr47), enhancement type (Tr48) and zero threshold type (Tr49).

Phosphous (P) is doped as an impurity for forming a normally on-state in the channel region to the area having the second impurity concentration of the MOSFETs in FIG. 6 and to the channel region of the depletion type MOSFETs in FIG. 8 under the conditions of 50 KeV of energy and $2.4 \times 10^{11}$ cm$^{-2}$ of dose amount.

Boron (B) is doped as an impurity for increasing the threshold voltage to the area having the second impurity concentration of the MOSFETs in FIG. 7 and to the channel region of the enhancement type MOSFETs in FIG. 8 under the conditions of 40 KeV of energy and $4.5 \times 10^{11}$ cm$^{-2}$ of dose amount.

Figure 9:
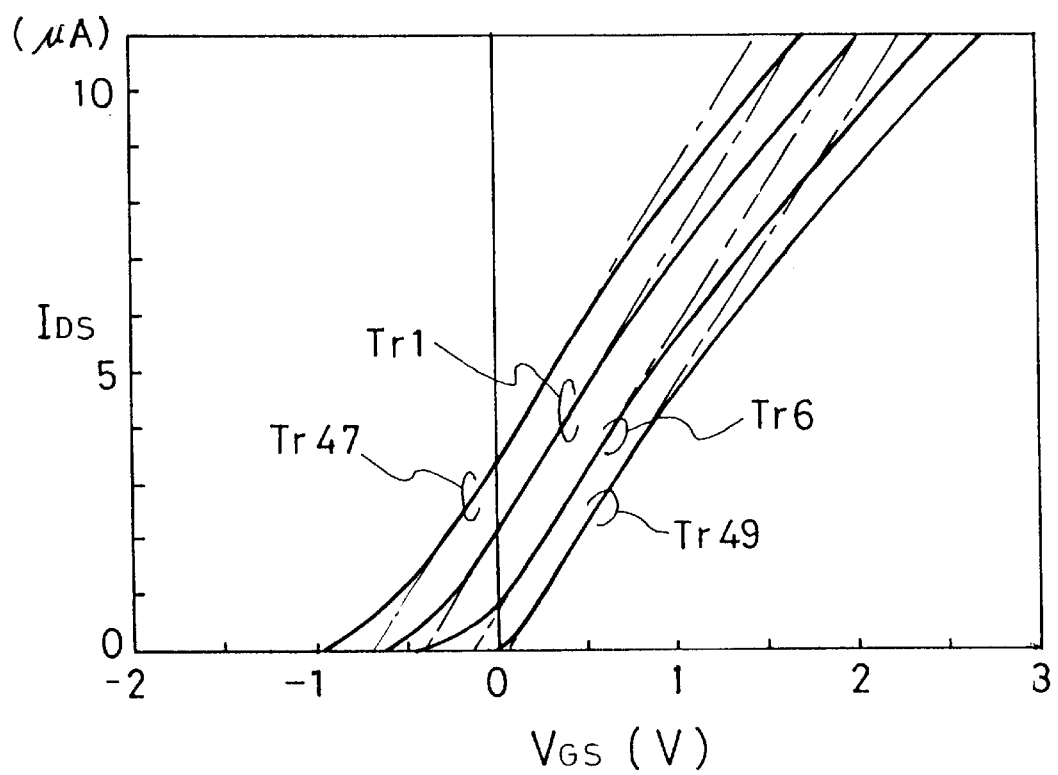
FIG. 9 is an explanatory graph showing a relationship between a drain current and a gate voltage when threshold voltages of the depletion type MOSFETs of the first embodiment of the present invention are measured.

FIG. 9 is a graph showing a relationship between a drain current ($I_{DS}$) and a gate voltage ($V_{GS}$) when threshold voltages of Tr47 and Tr49, the prior art transistors, and of transistors Tr1 and Tr6 of the embodiment of the present invention are measured.

The drain current ($I_{DS}$) here is the current measured when the, source and substrate are connected to the ground and 0.1 V is applied to the drain.

Further, the threshold voltage is assumed to be a value obtained by subtracting a half of the drain voltage, i.e. 0.05 V, from a X intercept of a tangent (shown by dashed line in FIG. 9) of each curve at the point where a gradient of the tangent is maximum.

Figure 10:
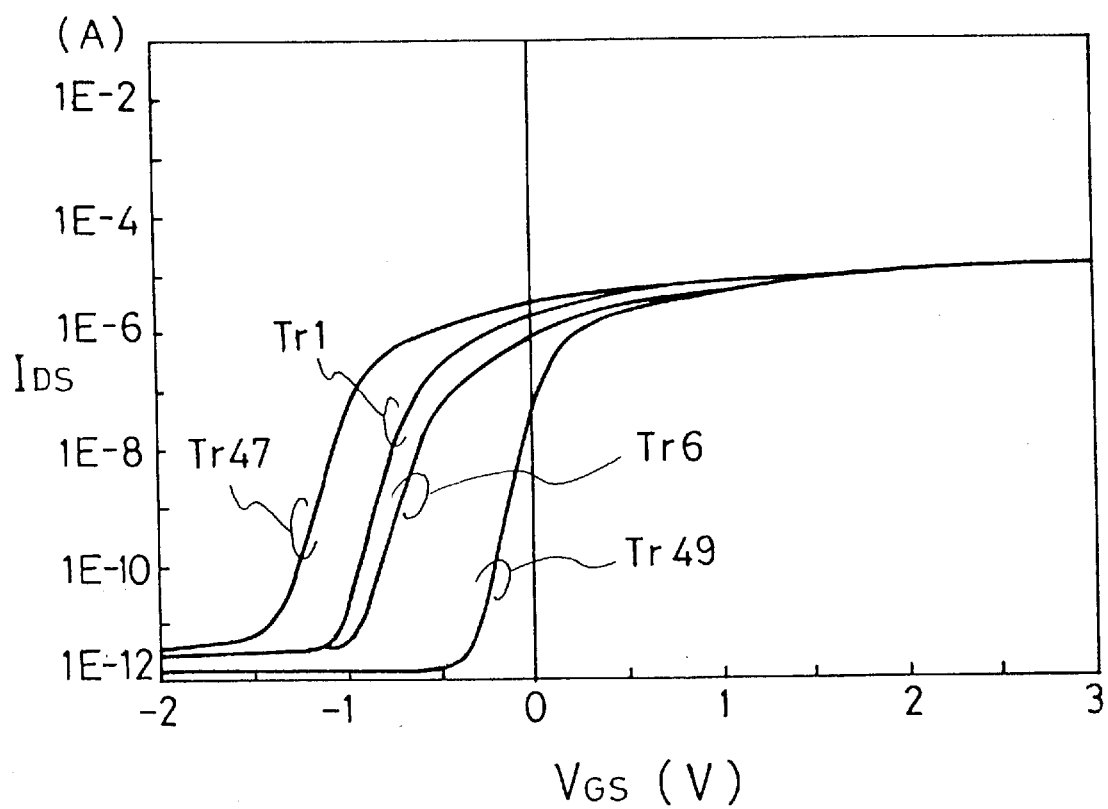
FIG. 10 is an explanatory graph showing sub-threshold currents by logarithmically showing the relationship between a drain current and a gate voltage when the threshold voltages of the depletion type MOSFETs of the first embodiment of the present invention are measured.

FIG. 10 is a graph showing characteristics of subthreshold currents of the aforementioned transistors Tr47, Tr49, Tr1 and Tr6. While the measuring conditions are the same with those in FIG. 9 wherein the threshold voltages are measured, the drain current ($I_{DS}$) which is the Y-axis is shown logarithmically.

It can be seen from FIGS. 9 and 10 that the present invention allows to readily put the both threshold voltage and drain current characteristics in the range between the prior art transistors.

Figure 11:
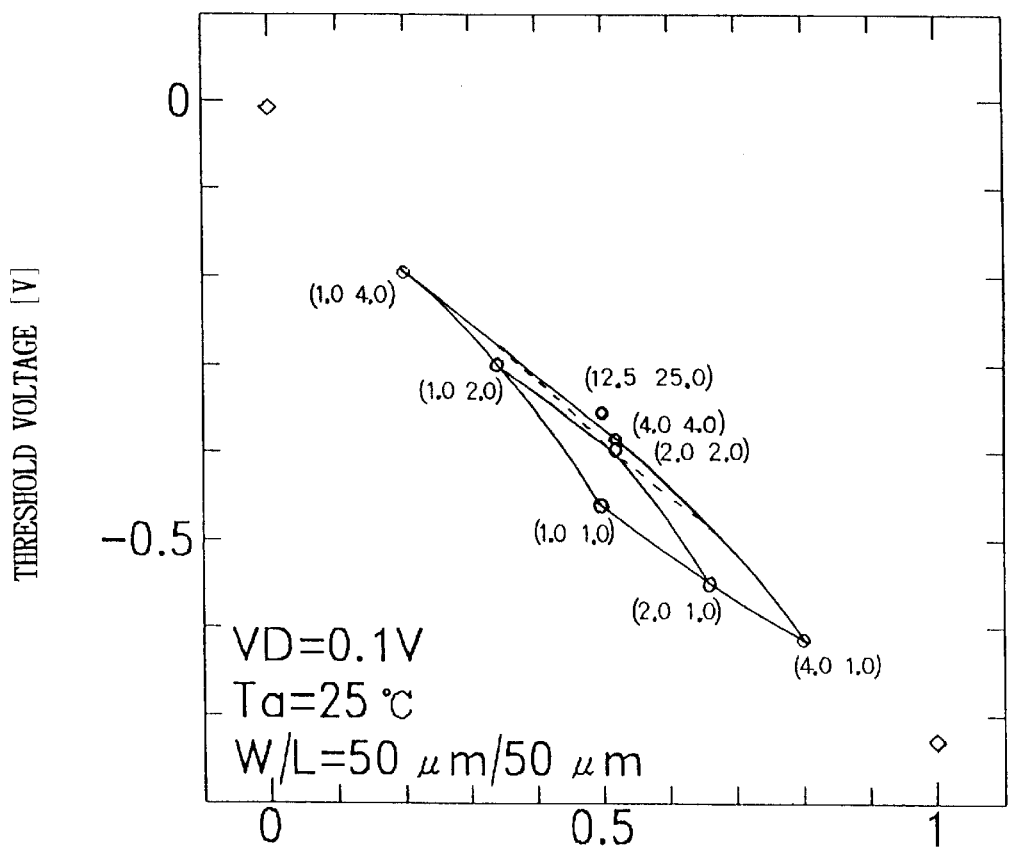
FIG. 11 is a graph showing a relationship between a threshold voltage and an area ratio of the area having the second impurity concentration to the whole channel region of the MOSFETs of the first embodiment among the MOSFETs shown in the table in FIG. 6 of the present invention.
Figure 12:
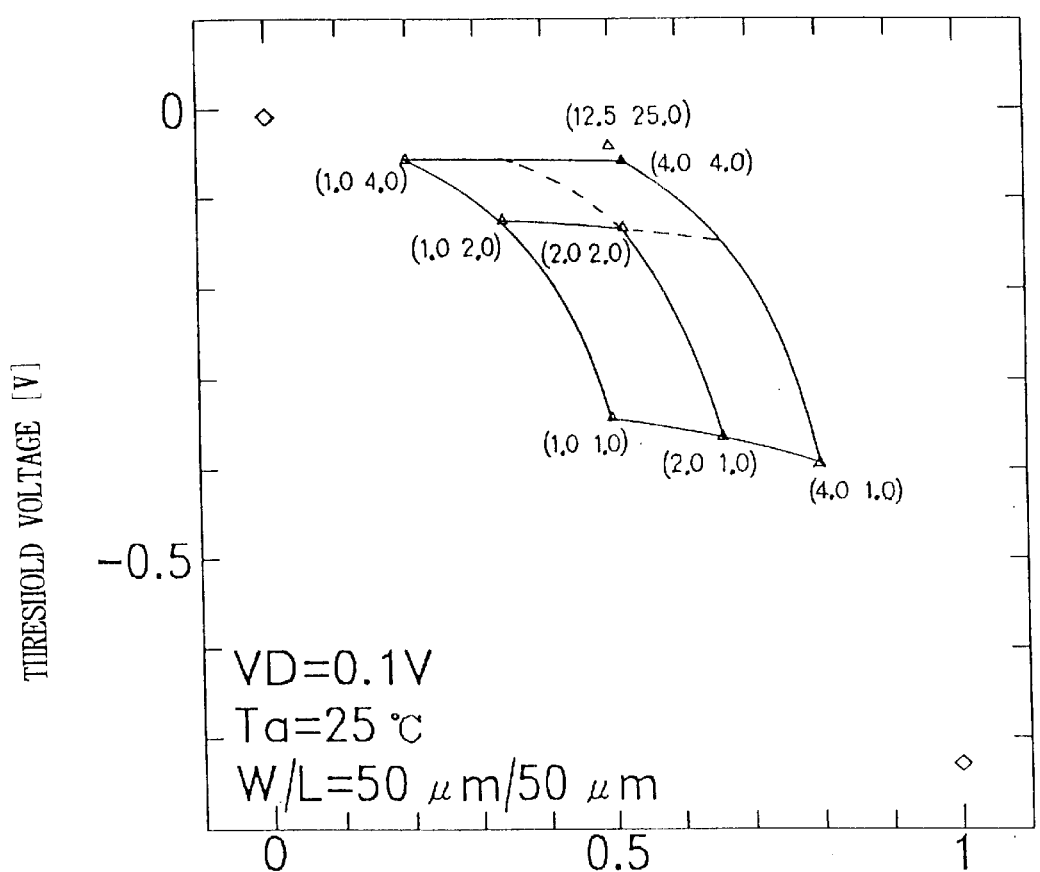
FIG. 12 is a graph showing a relationship between a threshold voltage and an area ratio of the area having the second impurity concentration to the whole channel region of the MOSFETs of the second embodiment among the MOSFETs shown in the table in FIG. 6 of the present invention.
Figure 13:
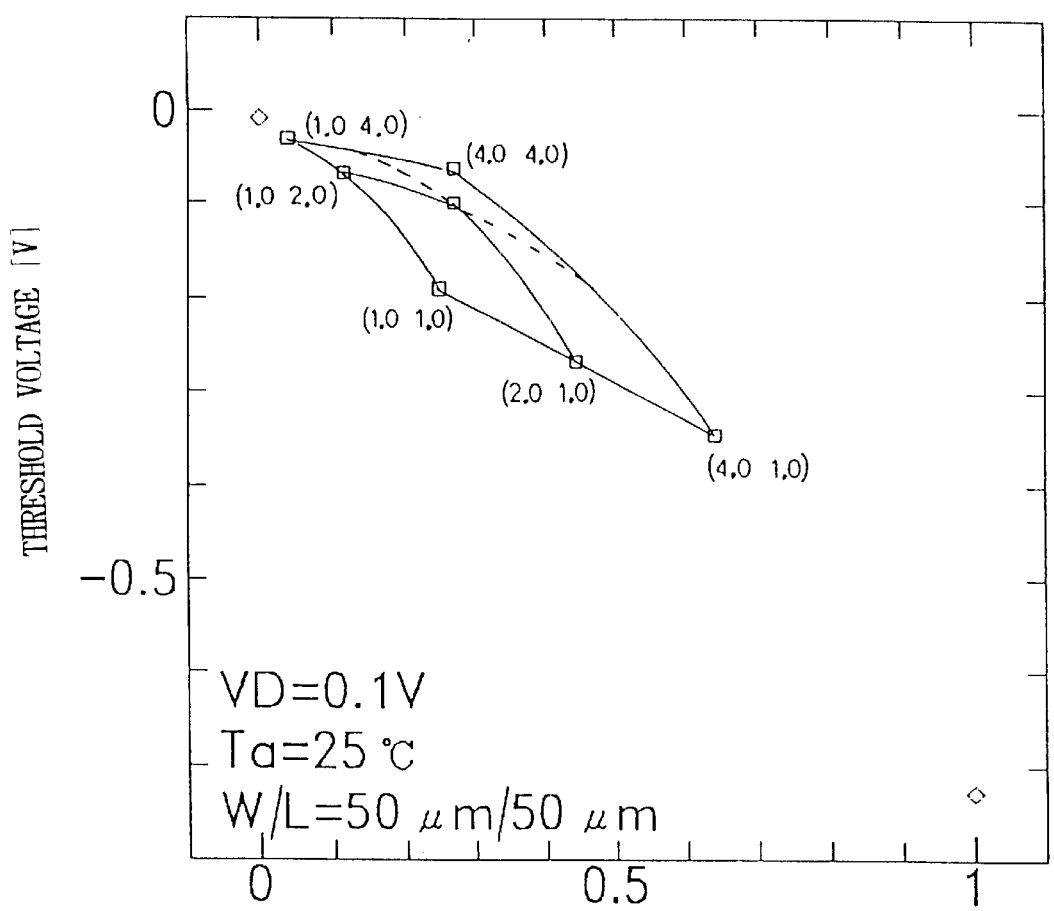
FIG. 13 is a graph showing a relationship between a threshold voltage and an area ratio of the area having the second impurity concentration to the whole channel region of the MOSFETs of the third embodiment among the MOSFETs shown in the table in FIG. 6 of the present invention.

FIGS. 11, 12 and 13 are graphs showing a relationship between a threshold voltage and an area ratio of the area having the second impurity concentration to the whole channel region of each transistor shown in FIG. 6 per shape of the region having the second impurity concentration. The prior art transistors Tr47 and Tr49 are also shown by diamond marks respectively as having an area ratio of "1" or "0".

While threshold voltages of the transistors in the first, second and third embodiments of the present invention are distributed between a threshold voltage (about 0.00 V) of the transistor Tr49 in which the whole channel surface has a first impurity concentration and a threshold voltage (about −0.73 V) of the transistor Tr47 in which the whole channel surface has a second impurity concentration, the shapes of the graphs differ considerably depending on the shapes of the region having the second impurity concentration and the threshold voltages change depending on the area ratio of the region having the second impurity concentration or the width and gap between the regions having the second impurity concentration.

Note that numeral values within parentheses in the figures represent (width, gap) of the area having the second impurity concentration in unit of [µm].

When the second impurity concentration regions are formed in strips in the direction parallel to the channel length, there is a strong correlation between the area ratio of the the second impurity concentration regions and the threshold voltage; it is almost proportional. The threshold voltage is changed more or less also by the width of the second impurity concentration region or the gap between the second impurity concentration regions.

When the second impurity concentration regions are formed in strips in the direction parallel to the channel width or in dots, it can be seen that there is a strong correlation with the gap between the second impurity concentration regions, i.e. the width of the region having the first impurity concentration having a high threshold voltage. That is, while the threshold voltage changes depending on the difference of the area ratio of the second impurity concentration regions, the threshold voltage is changed significantly by changing the width of the first impurity concentration region even if the area ratio is the same. At this time, the threshold voltage is changed more or less by the area ratio.

It can be also seen that when values of the threshold voltages when the gap between the second impurity concentration regions is changed while fixing the width thereof and values of the threshold voltages when the width is changed while fixing the gap are connected, each point form a grid on the graph.

Figure 14:
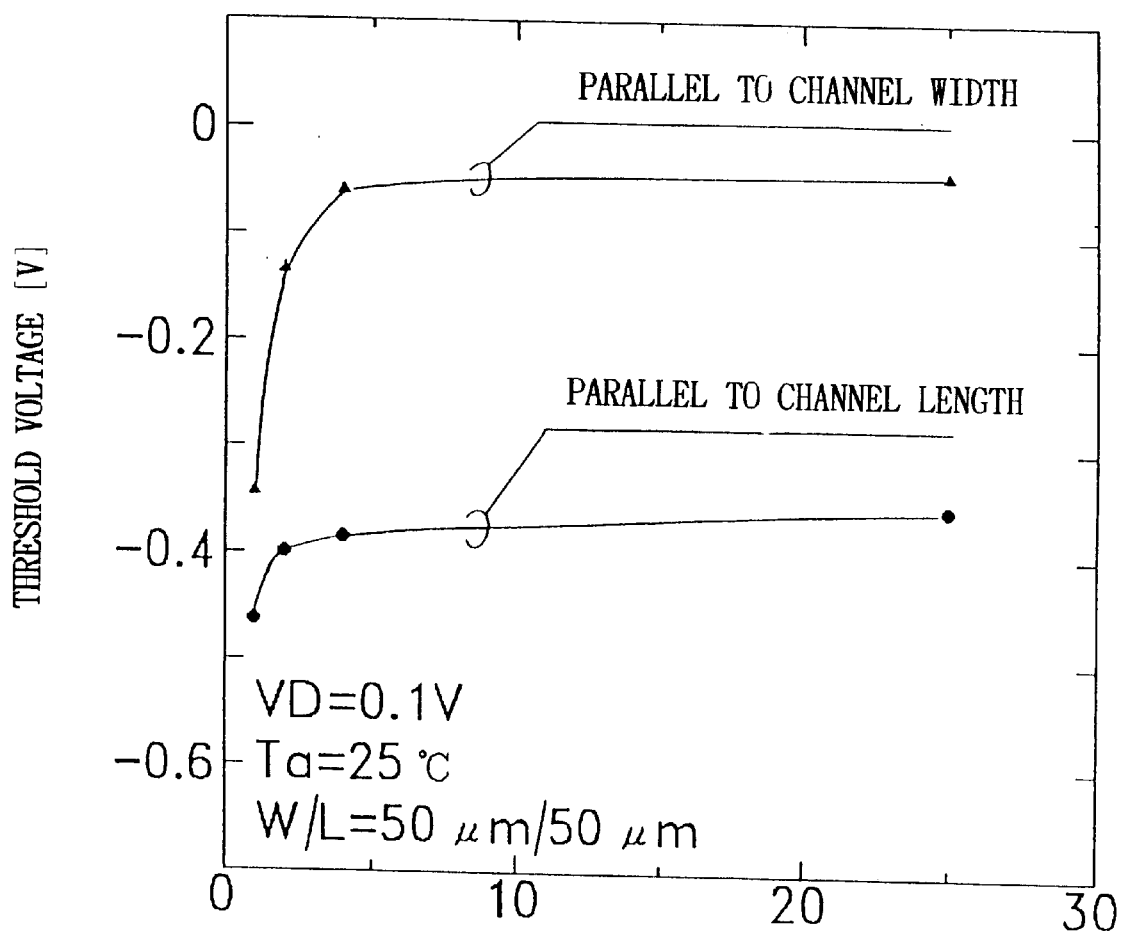
FIG. 14 is a graph showing a relationship between a threshold voltage of the MOSFETs of the first and second embodiments and a width of an region having the first impurity concentration among the MOSFETs shown in the chart in FIG. 6 of the present invention.

FIG. 14 is a graph showing changes of the threshold voltages when the width and the gap of the second impurity concentration regions are changed while fixing the area ratio (0.5).

It can be seen that the threshold voltages abruptly change when the width and gap become less than 4.0 µm. In particular, they abruptly change more when the second impurity concentration regions are formed in strips in the direction parallel to the channel width.

As described above, a desired threshold voltage may be arbitrary selected by adequately selecting the area ratio and shape of the second impurity concentration regions.

A desired threshold voltage may be arbitrary selected by adequately selecting the area ratio and shape of the second impurity concentration regions also in the MOS transistors in which the second impurity concentration regions form the enhancement type channel shown in FIG. 7.

Figure 15:
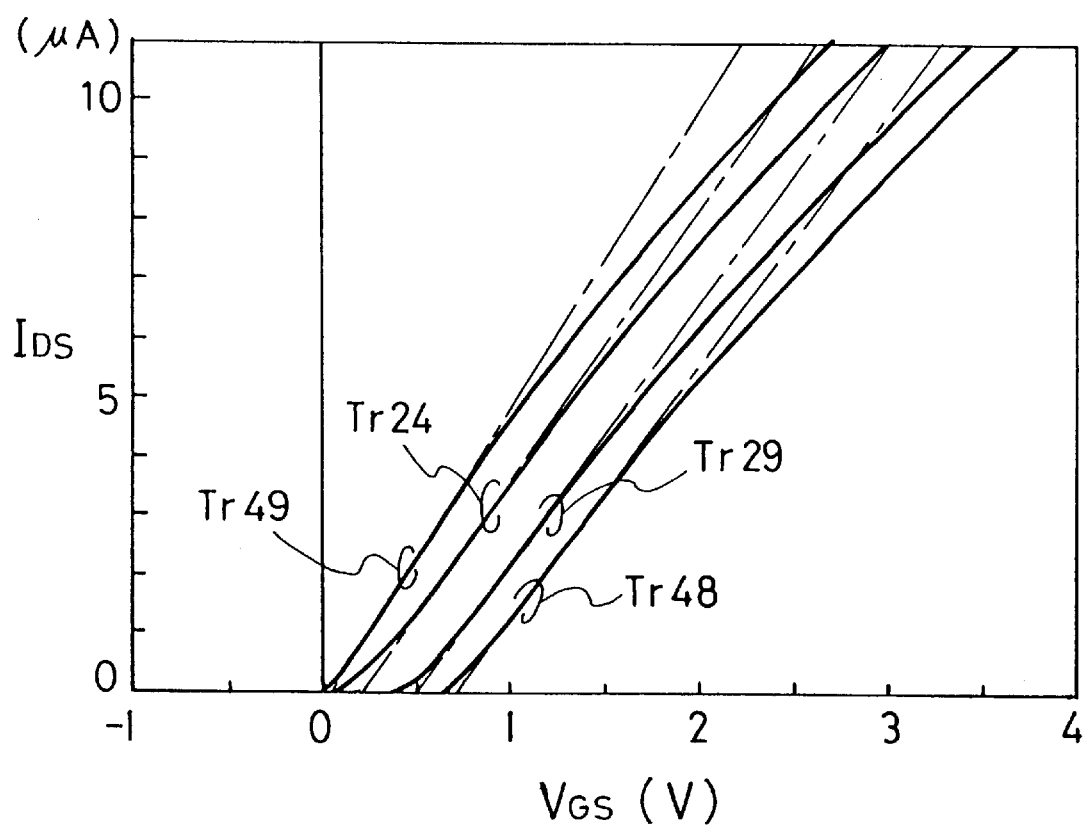
FIG. 15 is an explanatory graph showing a relationship between a drain current and a gate voltage when threshold voltages of the enhancement type MOSFETs of the first embodiment of the present invention are measured.

FIG. 15 is a graph showing a relationship between a drain current ($I_{DS}$) and gate voltage ($V_{GS}$) when threshold voltages of Tr47 and Tr49 of the prior art transistors and of enhancement transistors Tr24 and Tr29 of the embodiment of the present invention are measured.

Similarly to the case of the depletion transistors, the drain current ($I_{DS}$) is the current measured when the source and substrate are connected to the ground and 0.1 V is applied to the drain.

Further, the threshold voltage is assumed to be a value obtained by subtracting a half of the drain voltage, i.e. 0.05 V, from a X intercept of a tangent (shown by dashed line in FIG. 15) of each curve at the point where a gradient of the tangent is maximum.

Figure 16:
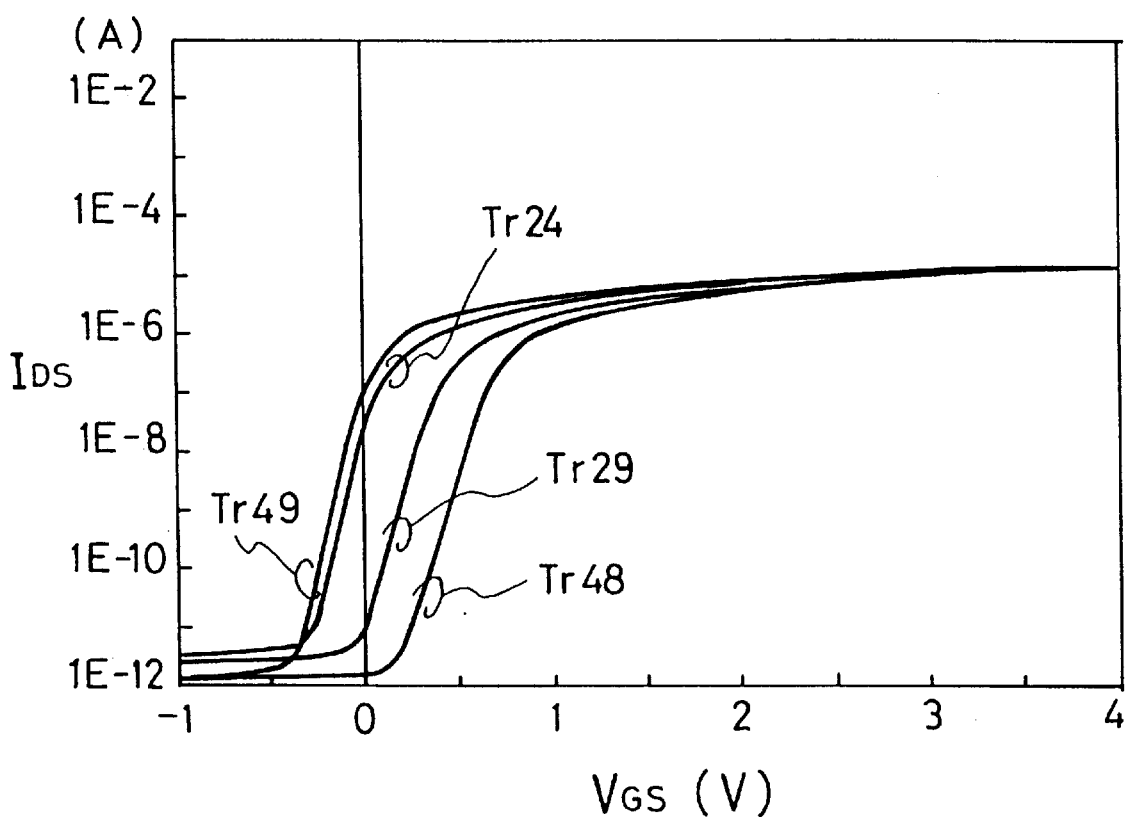
FIG. 16 is an explanatory graph showing sub-threshold currents by logarithmically showing the relationship between a drain current and a gate voltage when the threshold voltages of the enhancement type MOSFETs of the first embodiment of the present invention are measured.

FIG. 16 is a graph showing characteristics of subthreshold currents of the aforementioned transistors Tr47, Tr49, Tr24 and Tr29. While the measuring conditions are the same with the case in FIG. 15 wherein the threshold voltages are measured, the drain current ($I_{DS}$) which is the Y-axis is shown logarithmically.

It can be seen from FIGS. 15 and 16 that the present invention allows to readily put the both threshold voltage and drain current characteristics in the range between the prior art transistors also in the case of the enhancement transistors.

Figure 17:
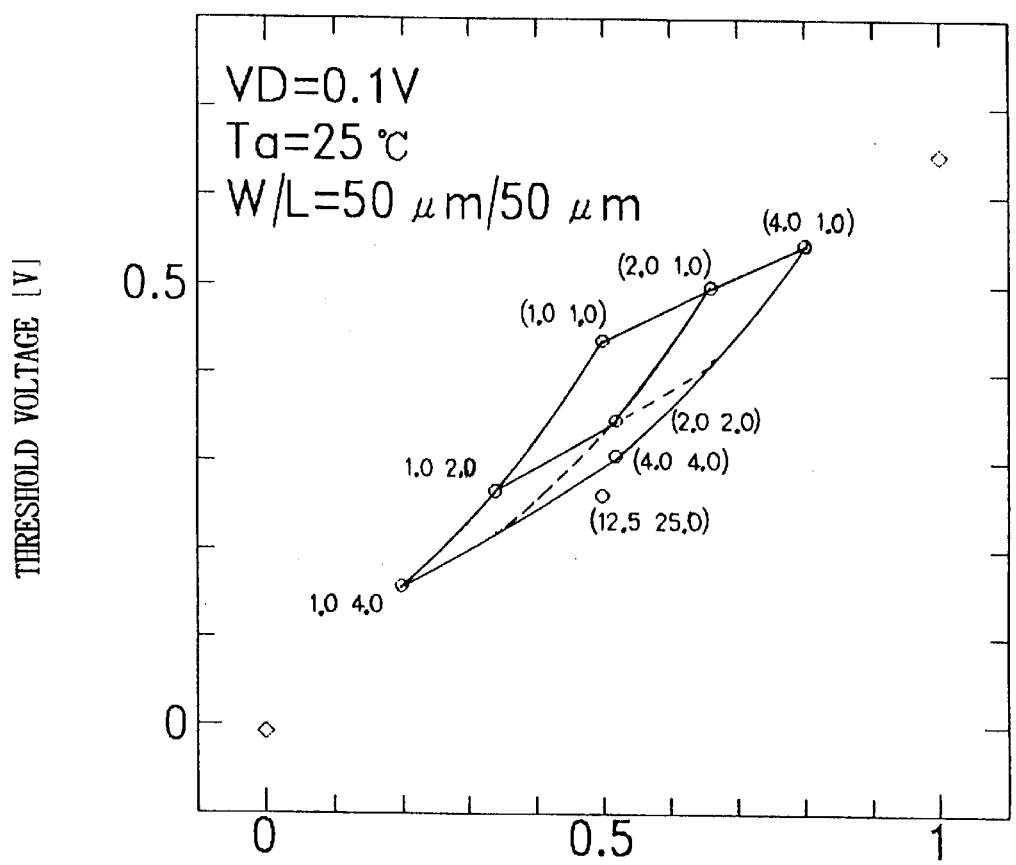
FIG. 17 is a graph showing a relationship between a threshold voltage and an area ratio of the area having the second impurity concentration to the whole channel region of the MOSFETs of the first embodiment among the MOSFETs shown in the table in FIG. 7 of the present invention.
Figure 18:
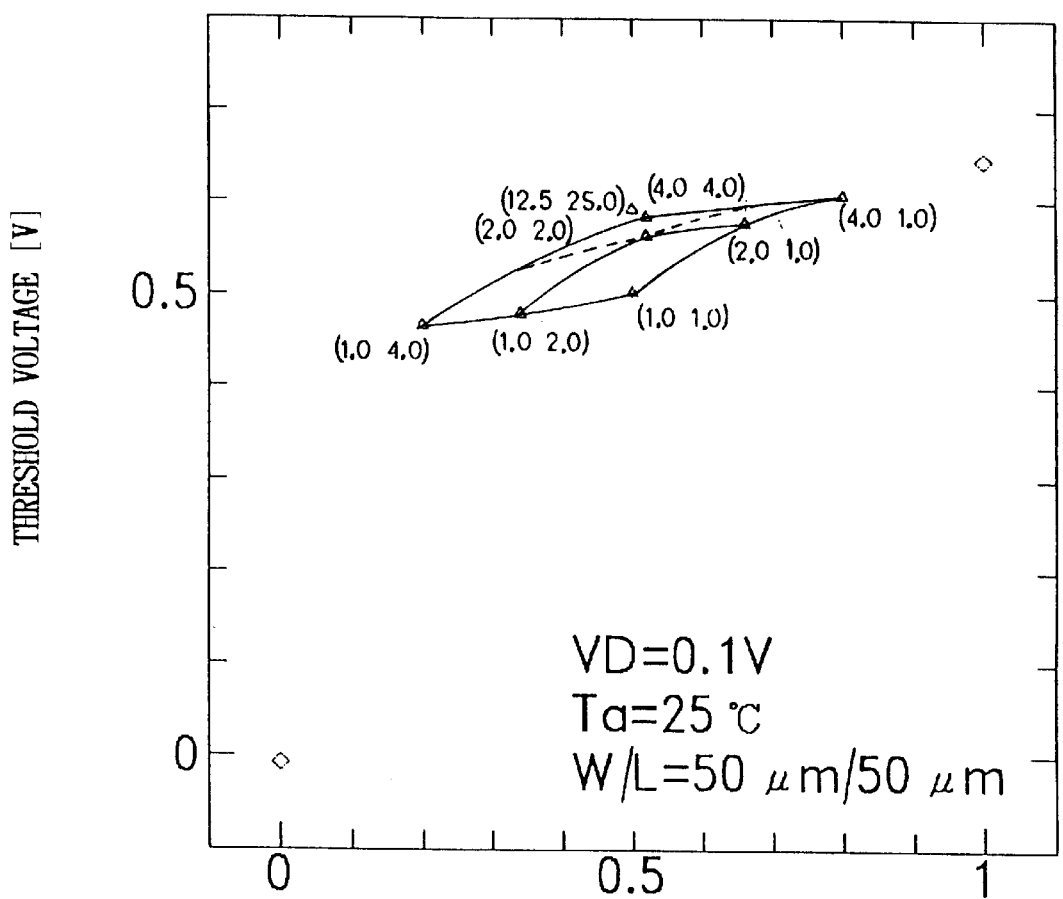
FIG. 18 is a graph showing a relationship between a threshold voltage and an area ratio of the area having the second impurity concentration to the whole channel region of the MOSFETs of the second embodiment among the MOSFETs shown in the table in FIG. 7 of the present invention.
Figure 19:
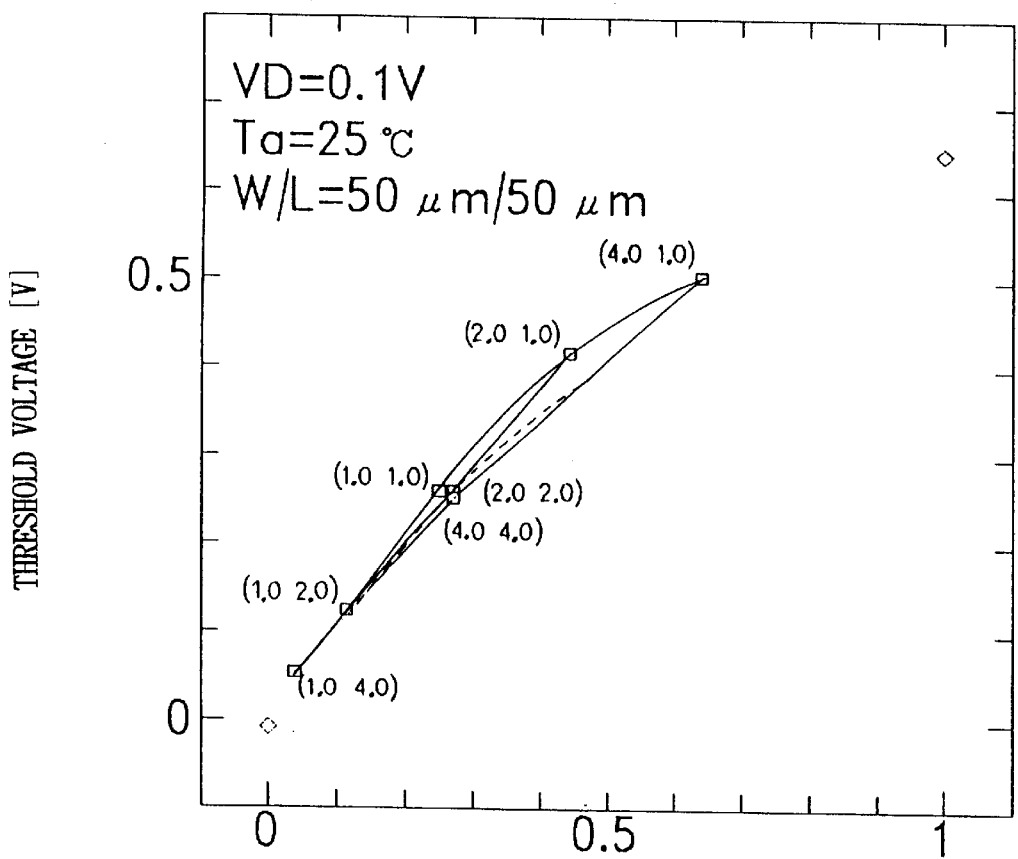
FIG. 19 is a graph showing a relationship between a threshold voltage and an area ratio of the area having the second impurity concentration to the whole channel region of the MOSFETs of the third embodiment among the MOSFETs shown in the table in FIG. 7 of the present invention.

As shown in FIGS. 17, 18 and 19, a desired threshold voltage may be arbitrary selected by adequately selecting the area ratio and shape of the second impurity concentration areas also in the case of the enhancement transistors shown in FIG. 7.

The prior art transistors Tr48 and Tr49 are also shown by diamond marks respectively as having an area ratio of "1" or "0" in FIGS. 17, 18 and 19.

Note that numeral values within parentheses in the figures represent (width, gap) of the area having the second impurity concentration in unit of [μm].

Figure 20:
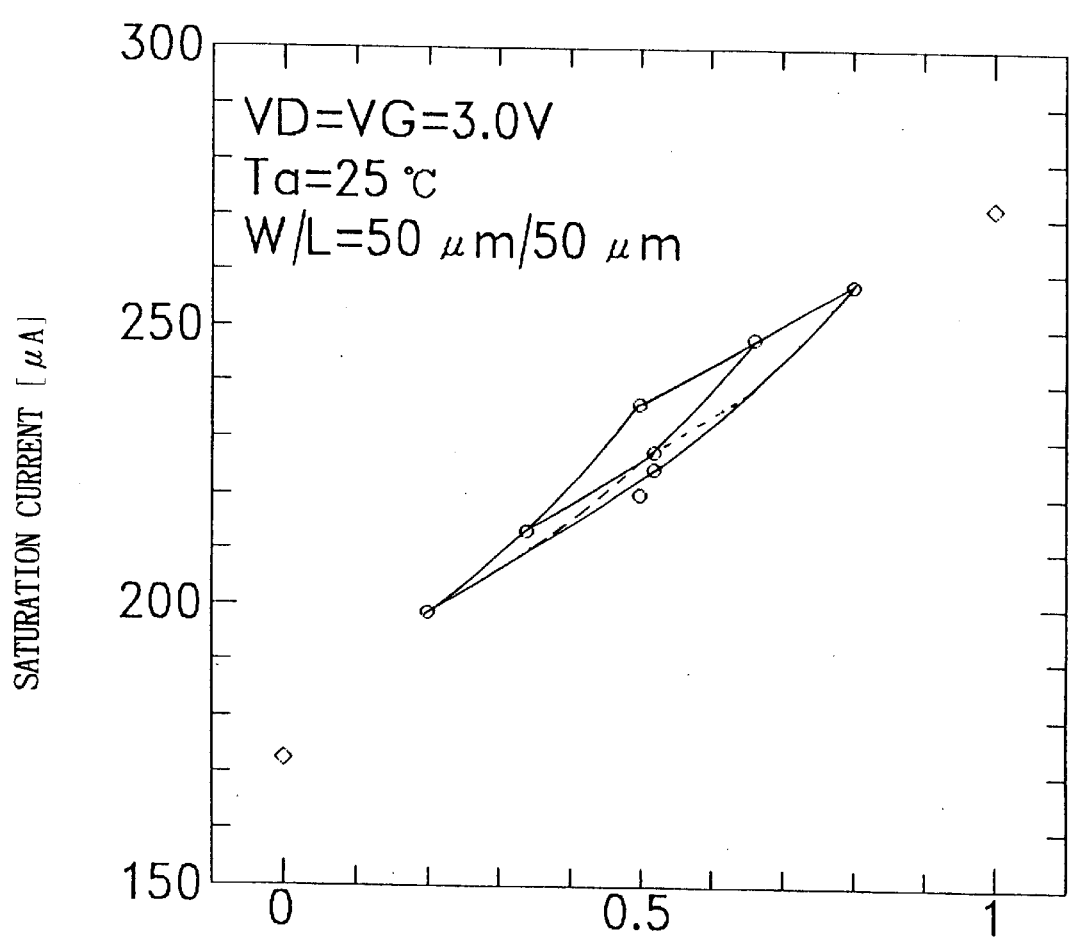
FIG. 20 is a graph showing a relationship between a saturation current value and an area ratio of the area having the second impurity concentration to the whole channel region of the MOSFETs of the first embodiment among the MOSFETs shown in the table in FIG. 6 of the present invention.

FIG. 20 is a graph showing a relationship between a saturation current value and an area ratio of the second impurity concentration regions to the whole channel region of transistors Tr1 through Tr8 in which the second impurity concentration regions are formed in strips parallel to the channel width among each depletion transistor shown in the table in FIG. 6.

Similarly to the threshold voltages, the area ratio and the saturation current value of the second impurity concentration regions constitute almost a proportional relationship.

Figure 21:
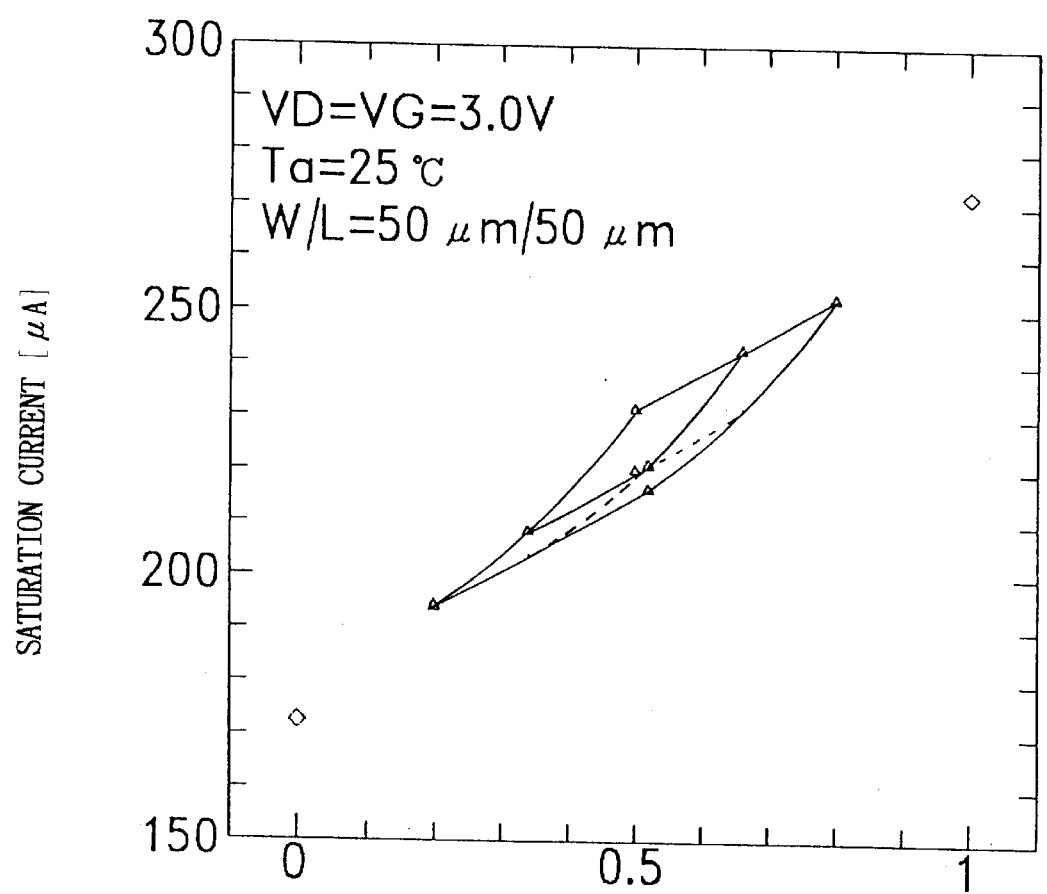
FIG. 21 is a graph showing a relationship between a saturation current value and an area ratio of the area having the second impurity concentration to the whole channel region of the MOSFETs of the second embodiment among the MOSFETs shown in the table in FIG. 6 of the present invention.

FIG. 21 is a graph showing a relationship between a saturation current value and an area ratio of the second impurity concentration regions to the whole channel region of transistors Tr9 through Tr16 in which the second impurity concentration regions are formed in strips parallel to the channel width among each depletion type transistor shown in the table in FIG. 6.

The area ratio and the saturation current value of the second impurity concentration regions constitute almost a proportional relationship similarly to the threshold voltage also in this case.

While the cases of the N-channel type MOSFETs have been described in the above-mentioned embodiments, the same characteristics may be obtained also with the P-channel type MOSFETs.

Further, although the threshold voltage of the MOSFET in the native state has been assumed to be almost 0 V in the present embodiment, the present invention is not confined to that and it allows not only to set a desired threshold voltage by adequately selecting the shape and area ratio of the second impurity concentration regions even in the enhancement state or depletion state in which a threshold voltage of a native MOSFET is more strong, but also to freely form a MOSFET having all threshold voltages from enhancement to depletion on a semiconductor substrate or well having the same impurity concentration by one time of impurity doping process.

When the threshold voltage of the MOSFET in the native state is almost 0 V, an enhancement type MOSFET and a depletion type NMOSFET may be manufactured in the same time by a one time photoresist optical patterning process and two times of impurity doping processes by doping boron (B) as an impurity for setting the MOSFET at an enhancement type desired threshold voltage to the whole surface of the channel region without using photoresist in the N-channel MOSFET for example and then by doping phosphorus (P) selectively using a photoresist only at necessary parts to fabricate the depletion type MOSFET.

A transistor having a desired threshold voltage may be fabricated by changing an area ratio and shape of the enhancement type region and the depletion type region within the channel at this time.

Furthermore, a threshold voltage and driving ability of each MOSFET may be obtained more stably by structuring so that peaks of concentration profiles of boron and phosphorus as impurities in the channel region are positioned substantially at the same position (e.g. within ±20 nm).

The boron doping process described above may not be necessary in the enhancement state in which the threshold voltage of the MOSFET in the native state is more strong.

The following combinations are exemplary combinations of those local threshold voltages, i.e. combinations of a surface inversion voltage of the first impurity concentration region and a surface inversion voltage of the second impurity concentration region:

1) N-channel type MOSFET in which a surface inversion voltage of the first impurity concentration region is −0.01 through 0.3 V and a surface inversion voltage of the second impurity concentration regions is −0.01 through −1.0 V;
2) N-channel type MOSFET in which a surface inversion voltage of the first impurity concentration region is −0.01 through 0.3 V and a surface inversion voltage of the second impurity concentration regions is 0.3 through 5.0 V;
3) N-channel type MOSFET in which a surface inversion voltage of the first impurity concentration region is 0.3 through 5.0 V and a surface inversion voltage of the second impurity concentration regions is −0.01 through −1.0 V;
4) P-channel type MOSFET in which a surface inversion voltage of the first impurity concentration region is 0.01 through −0.3 V and a surface inversion voltage of the second impurity concentration regions is 0.01 through 1.0 V;
5) P-channel type MOSFET in which a surface inversion voltage of the first impurity concentration region is 0.01 through −0.3 V and a surface inversion voltage of the second impurity concentration regions is −0.3 through −5.0 V; and
6) P-channel type MOSFET in which a surface inversion voltage of the first impurity concentration region is −0.3 through −5.0 V and a surface inversion voltage of the second impurity concentration regions is 0.01 through 1.0 V.

As for the method for positioning the impurity profiles of boron and phosphorus described above substantially at the same position, the photoresist needs not be formed partially on the channel when only one type each of the depletion type MOSFET and the enhancement type MOSFET is formed. They may be formed by coating the whole or by not coating.

FIGS. 22A to 22H show a manufacturing method of this case as a fifth embodiment.

Figure 22A:
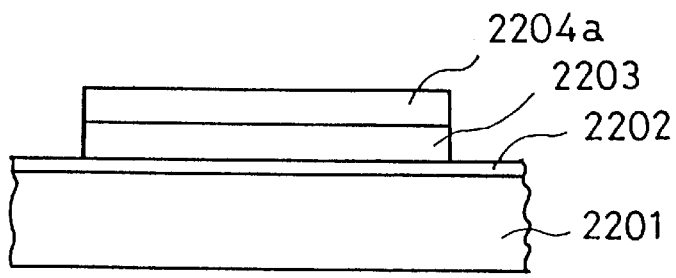
FIGS. 22A to 22H are section views sequentially showing processes for manufacturing a semiconductor device according to a fifth embodiment of the present invention.

At first, as shown in FIG. 22A, a thermal oxide film 2202 is formed on the surface of a P-type silicon substrate 2201 having a resistivity of 10 to 20Ω·cm and a silicon nitride film 2203 having a thickness of 100 to 150 nm is formed on the whole surface by CVD. After that, a photoresist pattern 2204a is provided on the silicon nitride film 2203 and using it as a mask, the silicon nitride film 2203 is removed by plasma etching to expose part of the oxide film 2202.

Figure 22B:
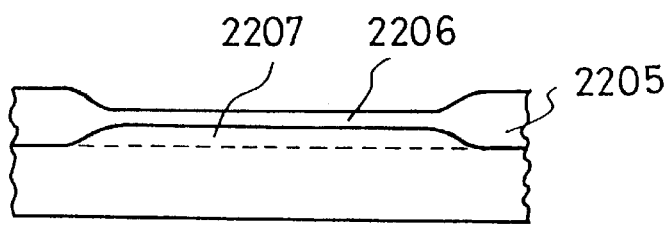

Next, as shown in FIG. 22B, a field oxide film 2205 having a thickness of 500 to 1200 nm is formed by thermal oxidation after peeling off the photoresist pattern 2204*a*. Then, the silicon nitride film 2203 and the oxide film 2202 below that are removed to form a new thermal oxide film 2206 into a thickness of 40 nm. Next, boron ions are implanted to a depth of around 80 nm from the surface of the thermal oxide film 2206 by 25 keV of energy to form a P-type region 2207, which will become a channel region of an enhancement type MOSFET, having a higher impurity concentration than that of the P-type silicon substrate 2201.

Figure 22C:
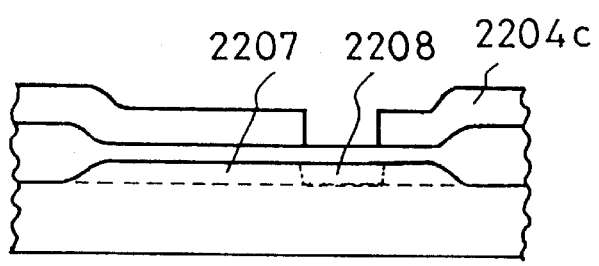

Then, as shown in FIG. 22C, a new photoresist pattern 2204*c* having an opening is created and phosphorus ions are implanted from the opening to a depth of around 80 nm from the surface of the thermal oxide film 2206 by 75 keV of energy to convert a channel region of a depletion type MOSFET to an N-type region 2208.

At this time, while the opening is normally provided at all the part which will become the channel region of the depletion type MOSFET, a MOSFET having a desired threshold voltage may be created in response to a shape of the photoresist pattern 2204*c* by forming the photoresist pattern 2204*c* selectively and partially at the channel region and by implanting phosphorus ions partially to the same channel region.

Figure 22D:
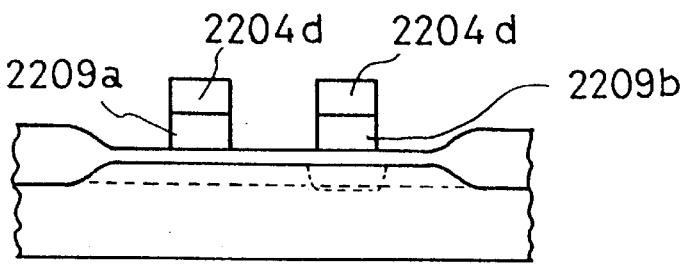

Next, as shown in FIG. 22D, a polysilicon film having a thickness of 350 to 400 nm is formed on the whole surface by CVD after peeling off the photoresist pattern 2204*c*. After that, a photoresist pattern 2204*d* is provided on the polysilicon film and using it as a mask, the polysilicon film is removed by dry etching to create polysilicon electrodes 2209*a* and 2209*b*.

Figure 22E:
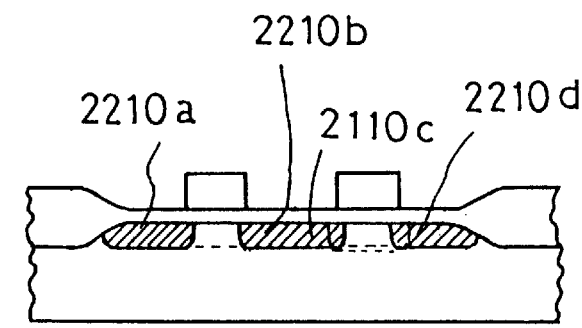

Next, as shown in FIG. 22E, phosphorus ions are implanted on the whole surface by a dose amount of about $5 \times 10^{15}$ cm$^{-2}$ after peeling off the photoresist pattern 2204*d* to create source regions 2210*a* and 2210*c* and drain regions 2210*b* and 2210*d* of the highly concentrated N-type region.

Figure 22F:
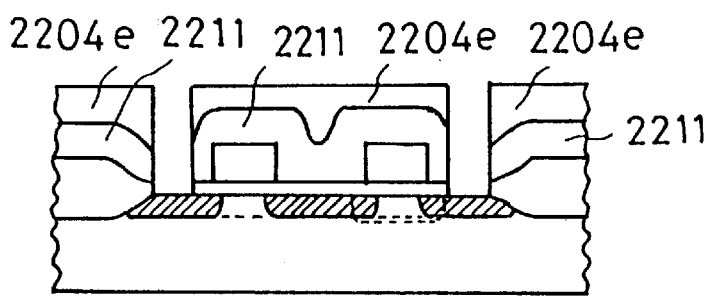

Next, as shown in FIG. 22F, a PSG film 2211 having a thickness of 500 to 1000 nm is formed on the whole surface by CVD. After that, a photoresist pattern 2204*e* is provided on the PSG film and using it as a mask, the PSG film 2211 is removed by wet etching or dry etching to create contact holes.

Figure 22G:
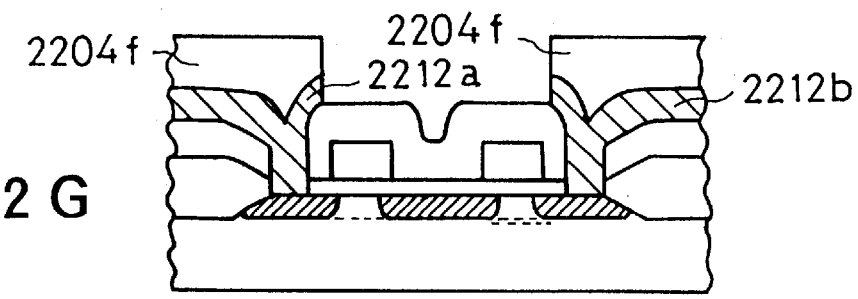

Next, as shown in FIG. 22G, an aluminum film having a thickness of 800 to 1200 nm is formed on the whole surface by sputtering after peeling off the photoresist pattern 2204*e*. After that, a photoresist pattern 2204*f* is provided on the aluminum film and using it as a mask, the aluminum film is removed by dry etching to create aluminum wires 2212*a* and 2212*b*.

Figure 22H:
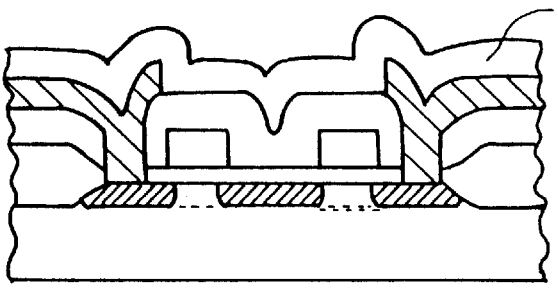

Next, as shown in FIG. 22H, a silicon nitride film 2213 is formed on the whole surface by CVD to protect the surface after peeling off the photoresist pattern 2204*f*. Then, a semiconductor device of an integrated circuit composed of the N-channel type MOSFET having enhancement and depletion type MOSFETs in the circuit is completed by providing openings through the silicon nitride film to expose bonding pad selections (not shown) of the aluminum wires 2212*a* and 2212*b*.

Figure 23:
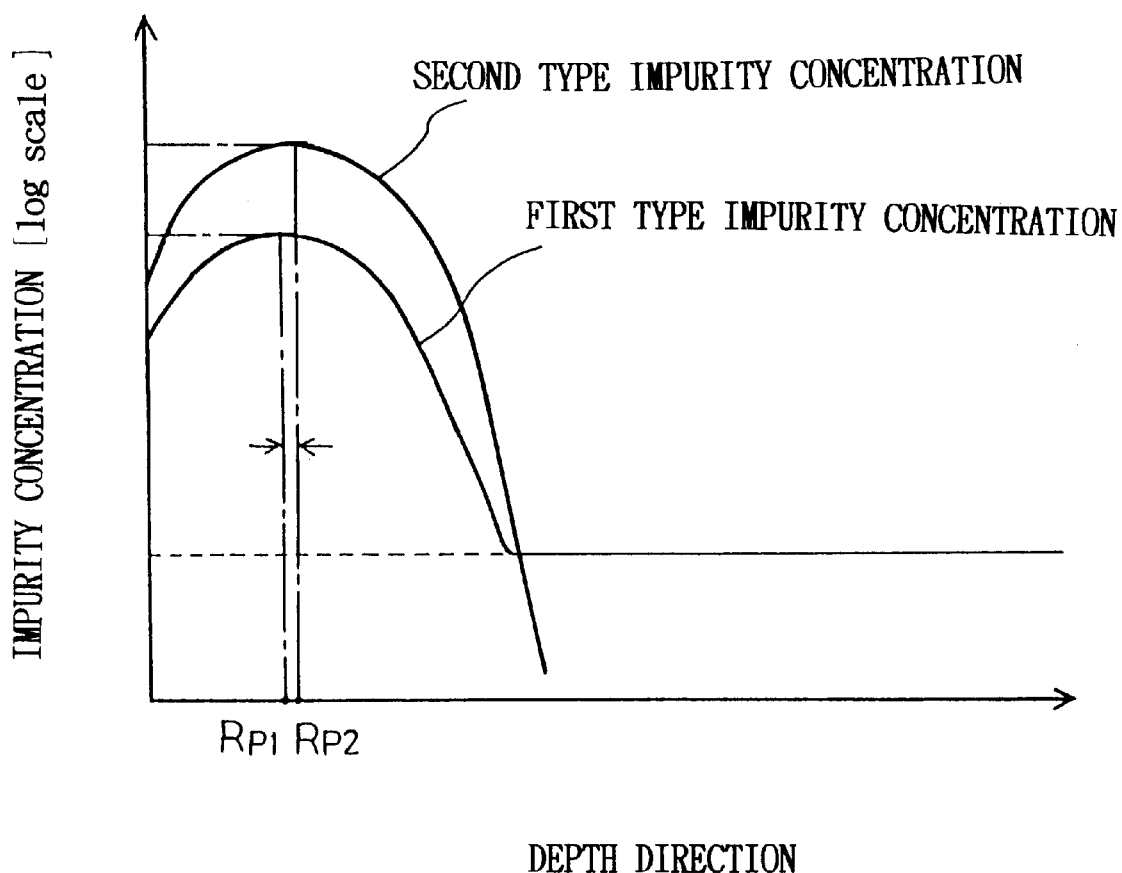
FIG. 23 shows a profile of impurity in a channel area of the depletion type MOSFET in the fifth embodiment of the present invention.
Figure 24:
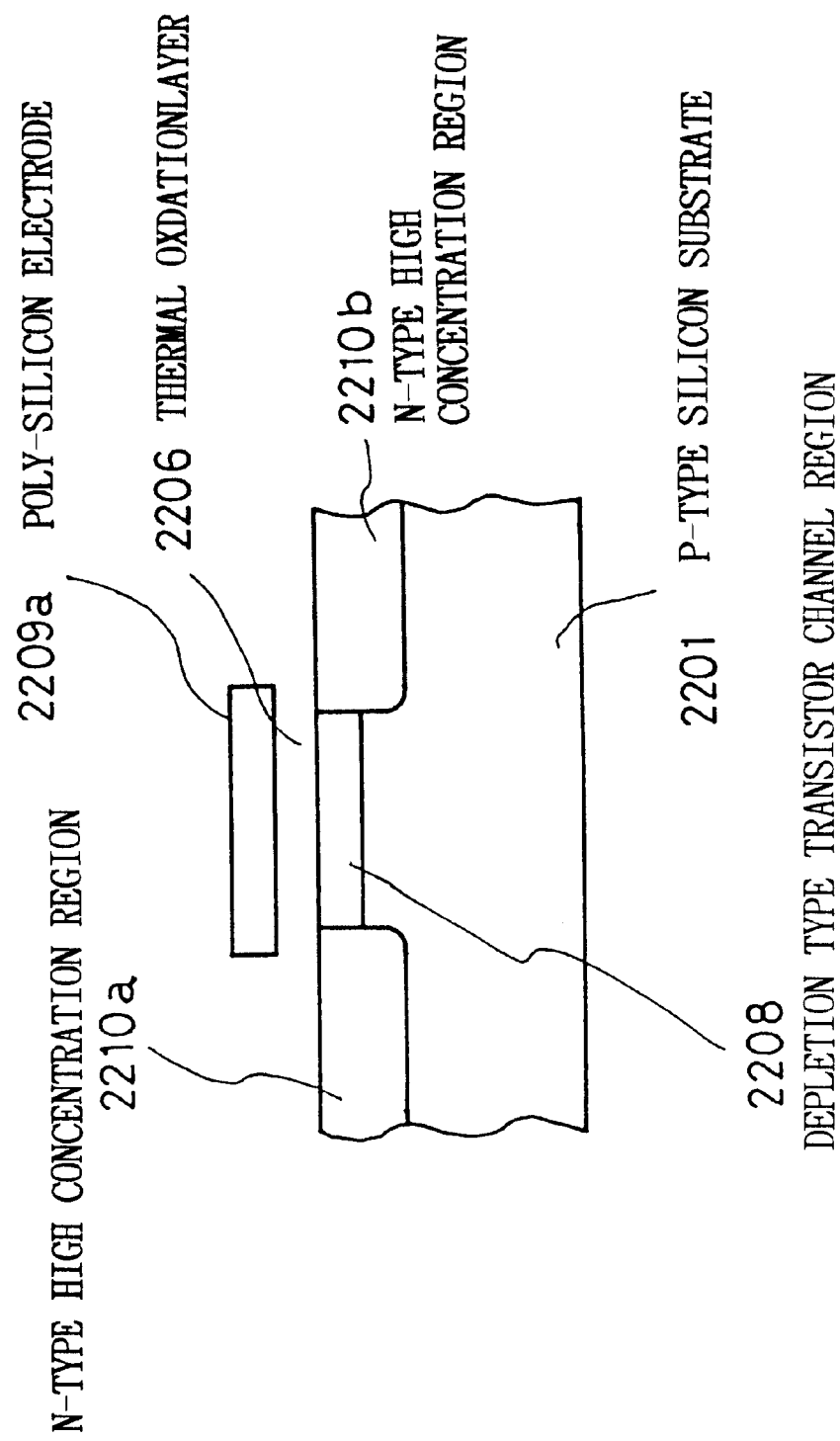
FIG. 24 is a section view of the depletion type MOSFET in the fifth embodiment of the present invention.

The semiconductor device of the integrated circuit composed of the N-channel type MOSFET manufactured by the method of the present embodiment has a depletion type MOSFET having a structure shown in FIG. 24 wherein impurities in the channel region 2208 and the silicon substrate 2201 of the depletion type MOSFET are boron as a first conductive impurity and phosphorus as a second conductive impurity distributed as shown in FIG. 23. A peak R$_{p1}$ of the first conductive impurity and a peak R$_{p2}$ of the second conductive impurity are positioned at the same position or at positions within ±20 nm.

By constructing as described above, the depth of the depletion type channel region is not affected by the concentration of boron and phosphorus and the threshold voltage and drive capability of the depletion type MOSFET may be obtained stably.

Although only the case of the N-channel type MOSFET has been shown in the fifth embodiment, the same effect may be obtained also with a semiconductor device of an integrated circuit of P-channel type or CMOS type of both the N-channel type and P-channel type transistors.

Figure 25:
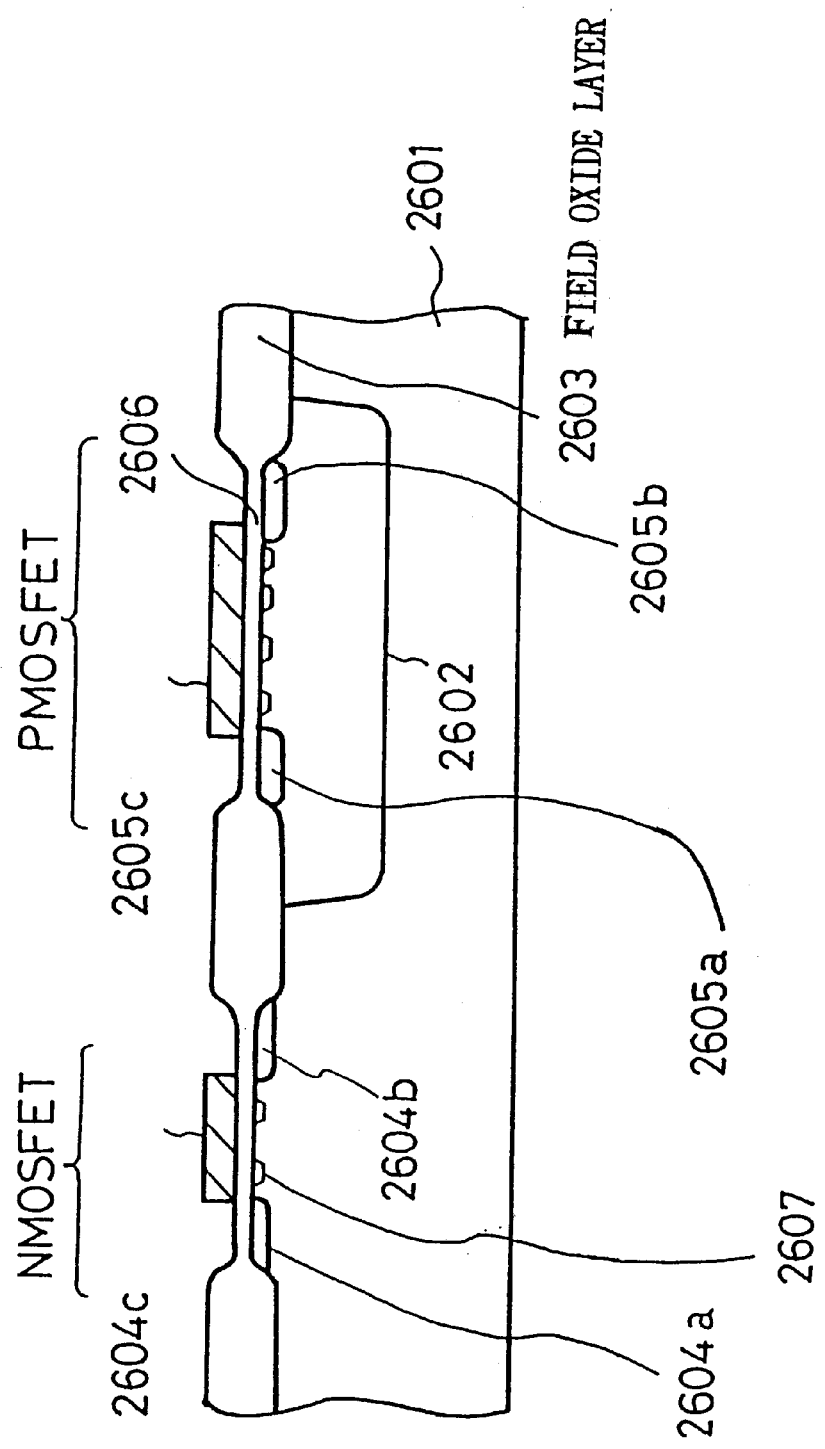
FIG. 25 is a section view showing a CMOSIC of a sixth embodiment of the present invention.

FIG. 25 is a selection view of a semiconductor device of an integrated circuit according to a sixth embodiment of the present invention.

An N well 2602 having a depth of around 1 to 5 μm is created on the surface of a P-type silicon substrate 2601. A P-type MOSFET is created within the N well 2602 where P-type source region 2605*a* and P-type drain region 2605*b* are provided interposing a channel region therebetween.

An N-type MOSFET is formed on the surface of the P-type silicon substrate 2601 where no N well 2602 is created. In the N-type MOSFET, an N-type source region 2604*a* and an N-type drain region 2604*b* are provided interposing a channel region therebetween. In a channel region which is the surface of the substrate 2601 between the source region 2604*a* and the drain region 2604*b*, a plurality of channel impurity regions 2607 similar to those in the first through fourth embodiments are provided in dots by being divided in plane. Gate electrodes 2604*c* and 2605*c* are provided on the surface of the channel region through the intermediary of a gate oxide film 2606. The P-type MOSFET is also formed in the same manner having an opposite conductive type.

A ratio of the channel impurity region of the P-type MOSFET to the whole channel region is differentiated from the N-type MOSFET to obtain a desired target value.

For example, when a threshold voltage of each when no channel impurity region 2607 is provided is 0.2 V (N-type MOSFET) and −1.5 V (P-type MOSFET), boron was implanted as an impurity element under ion implantation conditions of 40 keV and $4 \times 10^{11}$ cm$^{-2}$ to the whole surface of the channel region of the P-type MOSFET and selectively to the channel region of the N-type MOSFET with an area ratio of (0.2). That is, threshold voltage of the MOSFETs whose conductive types differ may be controlled to desired values by forming a resist pattern one time and by implanting ions by using the resist pattern as a mask. Although ions may be implanted to the channel region of each transistor with a different area ratio as shown in FIG. 25, generally an area ratio of either one is set at zero or one. The other remaining transistor controls a threshold value by an intermediate value between zero to one of the area ratio. While FIG. 25 shows the selection view of the sixth embodiment which is the embodiment of the present invention wherein the conductive types of the semiconductor regions, which are the substrate of each transistor, differ from each other, threshold voltages may be controlled in the same manner also in a case when the semiconductor regions have the same conductive type and different impurity concentrations.

For example, although not shown, when a P well having the same conductive type with the P-type semiconductor substrate and a denser impurity concentration was provided on the P-type semiconductor substrate and N-type MOSFETs were formed respectively in the P-type semiconductor substrate and the P well, a threshold voltage of the N-type MOSFET within the P well whose impurity concentration was denser was 0.3 V while that of the N-type MOSFET within the P-type semiconductor substrate was 0.1 V.

At this time, boron ions were implanted to the whole area of the channel region of the N-type MOSFET within the P type semiconductor substrate to control the threshold voltage to 0.6 V.

The same threshold voltage of 0.6 V could be obtained by implanting ions to the channel region of the N-type MOSFET within the denser P well with an area ratio of about 50%.

The channel impurity region 2607 has a distribution of impurity shallower than 100 nm because it is formed to be shallower than the source and drain regions and is generally formed by channel doping.

It is preferable to form the channel impurity region 2607 to be shallower than a depth of a depletion layer of the channel region formed when the channel region of each MOSFET is inverted in order to use the impurity of the channel impurity region 2607 electrically effectively for the control of threshold voltage. It is also necessary to provide at least five or preferably more than ten channel impurity regions within the channel region in order to improve the controllability of threshold voltages.

Or, it is necessary to set a gap between the regions where a new channel impurity is doped or a width thereof to be less than 4 $\mu$m or preferably less than 1 $\mu$m. This is because, as shown also in FIG. 14, a threshold voltage of the whole MOSFET hardly changes when a width of an region having a high threshold voltage locally is more than 4 $\mu$m. Further, although not shown, when a width of a part having a lower threshold voltage locally is more than 4 $\mu$m and it is continuously distributed between source and drain (e.g. in strips parallel to the channel length), leak current increases between the source and drain when the gate voltage is low. It is desirable also from that reason to set the gap between the regions where the new channel impurity is doped and the width thereof to be less than 4 $\mu$m.

The transistor in which a plurality of channel impurity regions are provided in the channel region to control threshold voltages requires at least four times, or preferably more than 10 times of channel region as compared to that of the prior art transistor in which ions are implanted to the whole surface or no ions are implanted. Accordingly, for a MOSFET composing a digital circuit in which input/output levels are processed only by "H" and "L" digital signals, the channel region is formed by homogeneous impurity region by using a minimum design rule as a semiconductor device of the present invention. For a MOSFET composing an analog circuit in which input/output levels are processed by analog signals which differ from a source voltage, it is preferable to compose the circuit by transistors of more than about 10 times of the transistor by the minimum rule and to control threshold voltages by providing a plurality of channel impurity regions in the channel region. Generally integrated circuits comprise analog and digital circuits. However, an area of the analog circuit is generally small. Accordingly, the cost may be reduced because the manufacturing process may be simplified even if the area of the analog circuit slightly increases. In particular, it has a significant effect when a number of threshold voltages are necessary or when a number of threshold voltages exist before channel doping and they need to be adjusted.

However, when the impurity doping method is such which requires no optically patterned photoresist mask, e.g. when impurity ion beams are implanted directly and selectively to the channel region, the channel region of the transistor of the analog circuit needs not be larger than the channel region of the transistor of the digital circuit so much because the channel impurity region is not determined by the minimum dimension of the optical patterning of the photoresist.

The same applies to the case when either the channel width of channel length of the transistor is fully larger than the minimum processing dimension also when an impurity is doped using a photoresist as a mask.

Figure 26:
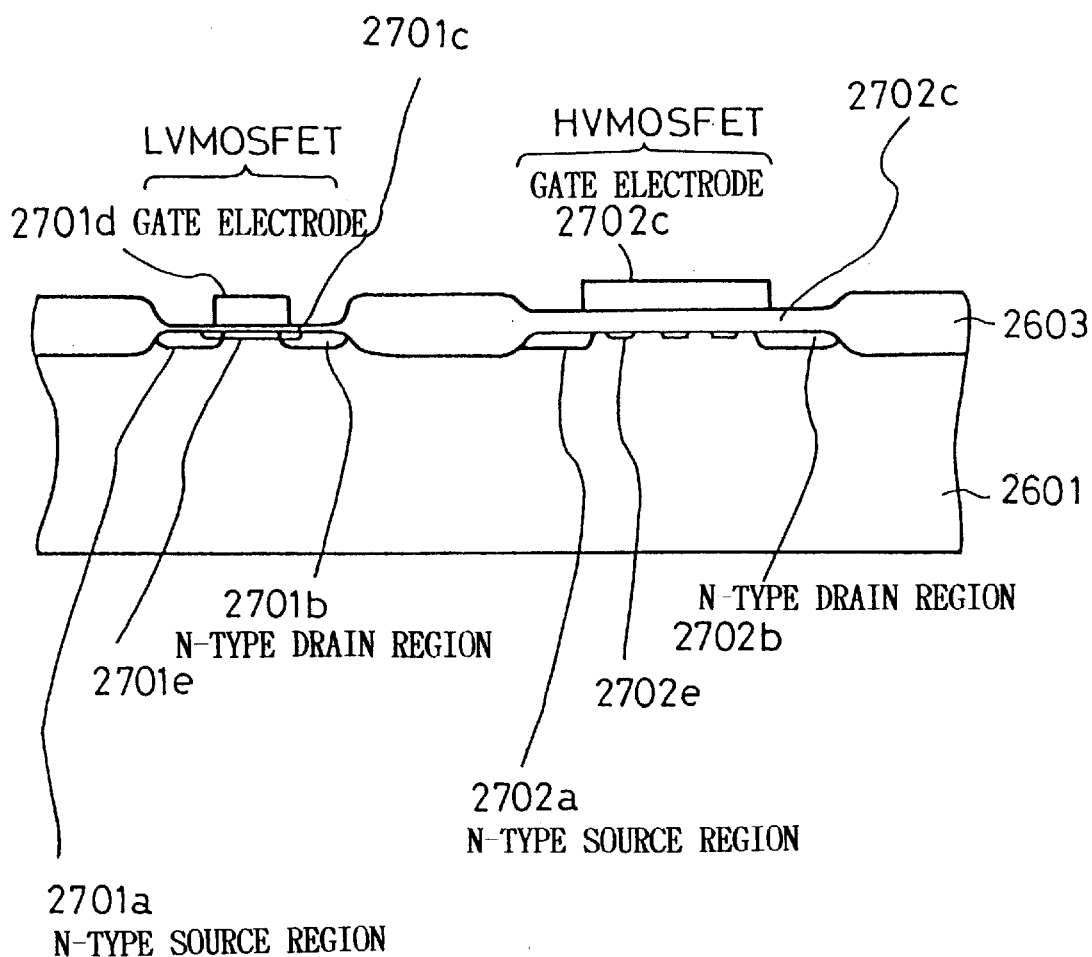
FIG. 26 is a section view of an IC including a high withstanding MOSFET according to a seventh embodiment of the present invention.

FIG. 26 is a selection view of a semiconductor device according to a seventh embodiment of the present invention. A low voltage MOS transistor (LVMOSFET) and a high withstand voltage MOS transistor (HVMOSFET) in which thicknesses of a gate insulating film differ are provided on a P-type silicon substrate 2601. The low voltage MOS structure has an N-type source region 2701a, an N-type drain region 2701b, a channel doping region 2701e and a gate electrode 2701d. The high withstand voltage MOS structure has an N-type source region 2702a, an N-type drain region 2702b, a channel doping region 2702e and a gate electrode 2702d. Because the LVMOSFET operates with a power supply voltage of 3 V, a thin gate oxide film 2701c is formed by a silicon oxide film of about 10 nm. The HVMOSFET is formed by a thick gate oxide film 2702c by a silicon oxide film of about 100 nm so that it can operate with a voltage (e.g. 30 V) larger than the power supply voltage. Further, because the oxide film of 10 nm is used as the gate insulating film in the LVMOSFET, a threshold voltage is controlled to 0.4 V by providing a channel impurity region 2701e on the whole surface of the channel region.

On the other hand, because the gate insulating film is so thick as 100 nm in the HVMOSFET, a threshold voltage will change significantly to more than 3 V if ions are implanted on the whole surface in the similar fashion.

Therfore, a channel impurity region 2702e is divided and formed at only 10% of the channel region only in the HVMOSFET as shown in FIG. 26 and as a result, the threshold voltage could be controlled to 0.8 V±0.1 V.

FIG. 26 shows the embodiment in which threshold voltages are controlled in the MOSFETs having the gate insulating film having different thicknesses. Although not shown, threshold voltages may be controlled in the same manner by using a gate insulating film made from a material having different dielectric constants. For example, the gate insulating film of the LVMOSFET may be formed by using a silicon oxide film and that of the HVMOSFET may be formed by using a three-layered composite film of silicon oxide film, silicon nitride film and silicon oxide film.

The threshold voltage of each transistor may be controlled to a desired value by one time of ion implantation by patterning the channel impurity region as shown in FIG. 26 also in such case.

FIGS. 27A to 27E are selection views sequentially showing processes for manufacturing the semiconductor device in FIG. 26.

At first, a field oxide film 2603 is formed on the surface of a substrate 2601 in order to separate each transistor electrically as shown in FIG. 27A. Generally, a silicon nitride film is patterned on a P-type silicon substrate through the intermediary of an oxide film by normal photolithographic technique.

Next, a field oxide film in FIG. 27A may be patterned by selectively oxidizing by using the silicon nitride film as a mask. No thick field oxide film 2603 is formed on the region where the silicon nitride film has been formed.

When the silicon nitride film and a thin oxide film below the silicon nitride film are removed after the selective oxidation, only the silicon surface of the transistor region is exposed as shown in FIG. 27A.

Next, as shown in FIG. 27B, a gate oxide film 2801 having a thickness of 100 nm is formed by a high temperature of about 1000° C. The field oxide film 2603 is a thick oxide film of more than 500 nm. In order to form a gate oxide film of 10 nm at the transistor region which will become LVMOSFET, a resist film 2802 is formed at the region of HVMOSFET as shown in FIG. 27B and the gate oxide film 2801 is removed by using the resist film 2802 as a mask.

Next, the silicon substrate 2601 is oxidized in a short oxidation time at a high temperature of about 1000° C. in the same manner. Because the gate oxide film of 100 nm has existed on the region of the HVMOSFET, the oxide film 2803 of 10 nm is formed as a gate oxide film only on the region of the LVMOSFET almost as it is.

Next, a resist film 2804 for forming channel impurity region is formed as shown in FIG. 27D. In FIG. 27D, the resist is formed on the whole surface in the region of the LVMOSFET. On the other hand, a plurality of windows of the resist divided in plane are formed within the channel region so that a plurality of channel impurity regions 2806 are formed in the channel region. Boron ions are implanted using the resist film 2804 as a mask.

Next, a gate electrode 2805 is formed on each gate insulating film. Although not shown, arsenic ions are implanted as N-type impurity using the gate electrode and the field oxide film as masks after forming the gate electrode 2805 to form source and drain regions of each MOSFET.

Next, an intermediate insulating film is formed on the whole surface to separate the Al wires and the gate electrode electrically.

Next, contact holes are created through the intermediate insulating film to contact each region and the gate electrode with the Al wires.

Next, the Al wires are patterned so as to cover the contact holes to complete the manufacturing of the semiconductor device.

The ion implantation process for forming the channel impurity region may be inserted between the process for forming the field oxide film 2603 shown in FIG. 27A and the process for forming the thick gate oxide film shown in FIG. 27B or between the process for forming the thick gate oxide film in FIG. 27B and the process for forming the thin gate oxide film in FIG. 27C. The yield of the semiconductor device of the integrated circuit may drop if the resist film 2804 is formed on the thin oxide film 2803 because the film quality of the thin gate oxide film 2803 degrades. Accordingly, generally the ion implantation process is carried out between the process for forming the thick gate oxide film and the process for forming the thin oxide film.

FIGS. 28A to 28F are selection views sequentially showing processes for manufacturing a semiconductor device using a SOI (Silicon On Insulator) substrate according to an eighth embodiment of the present invention.

The effect of the present invention may be increased when the channel region is formed by a silicon thin film as shown in FIGS. 28A to 28F. The silicon thin film may be applied in any cases when it is monocrystal, polycrystal or amorphous. The impurity concentration of the channel impurity region may be effectively controlled to control the threshold voltage by forming the channel region by the thin film. In particular, it may be more effectively controlled by forming the channel region so as to be thinner than the depletion layer during the inversion. It is because the threshold voltage is influenced primarily by the channel impurity region.

When a substrate is a thick substrate other than the SOI substrate, charges of the depletion layer are formed under the inversion layer when inverted. In the SOI substrate, there is less depletion charge amount because the channel region is a film thinner than the depletion layer. Although the depletion charge amount is a function of a concentration of the substrate, a threshold voltage is controlled almost by the distribution of impurity concentration within the channel region because there is no substrate.

The manufacturing method will be explained with reference to FIGS. 28A to 28F.

A monocrystal silicon film 2902 having a thickness of 100 nm is provided on the surface of a silicon substrate 2601 through the intermediary of an oxide film 2901 of 1 $\mu$m. A resist pattern 2903 for forming the channel impurity region is formed by a normal photolithographic technique. A plurality of windows of resist film is provided in the channel region of the MOSFET. Boron ions are implanted to the monocrystal silicon film 2902 using the resist film 2903 as a mask.

Figure 28A:
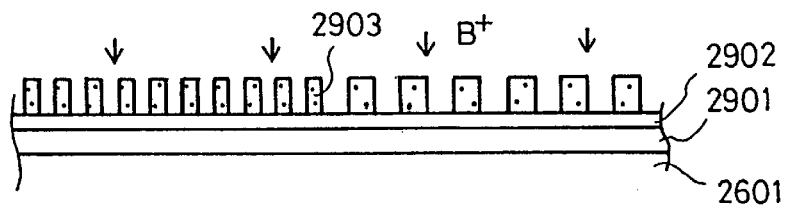
FIG. 28 is a section view sequentially showing processes for manufacturing a SOI semiconductor device according to an eighth embodiment of the present invention.
Figure 28B:
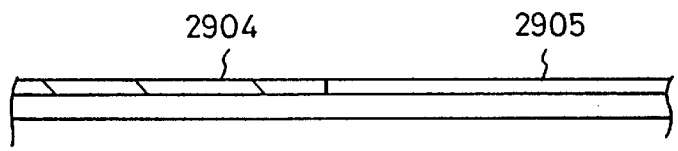

Next, the distribution of the impurity is averaged homogeneously by thermally diffusing boron at a high temperature of about 1000° C. as shown in FIG. 28B, as necessary. Next, a resist film 2906 is patterned in the transistor region by a normal photolithgraphic process to form separated regions.

Figure 28C:
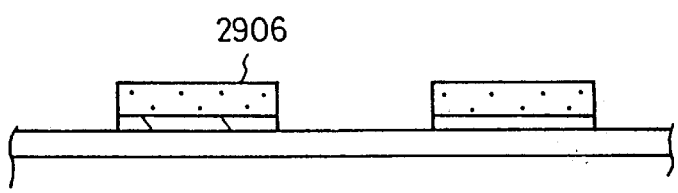

In FIG. 28C, the silicon films 2904 and 2905 having different distribution of impurity concentration are removed by etching by using the resist film 2906 as a mask. The separation and formation may be carried out by selective oxidation.

Figure 28D:
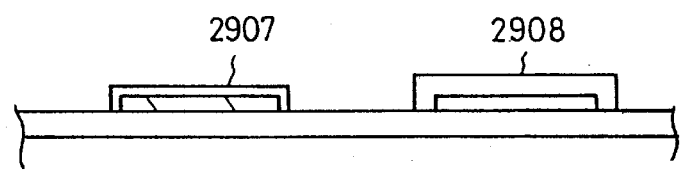

Next, a thin gate insulating film 2907 is formed on a LVMOSFET and a thick gate oxide film 2908 is formed on a HVMOSFET as shown in FIG. 28D.

Figure 28E:
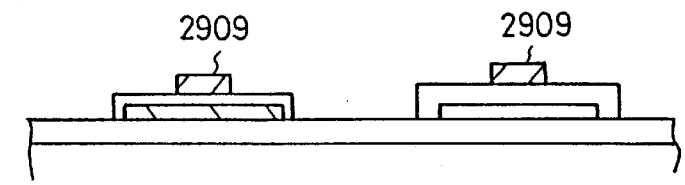
Figure 28F:
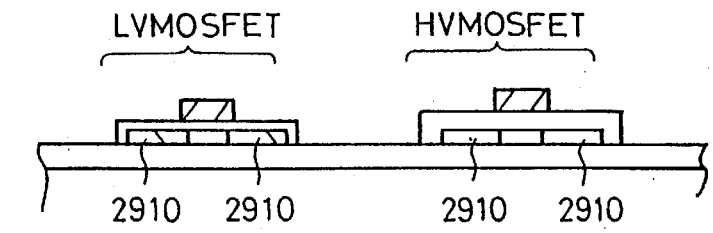

Then, a gate electrode 2909 is formed on each gate insulating film as shown in FIG. 28E.

Next, N-type impurity is ion-implanted using the gate electrode 2909 as a mask to form source and drain regions 2910 of the LVNMOSFET and HVNMOSFET as shown in FIG. 28D, thereby completing the transistors. The plurality of channel impurity-regions formed by implanting ions in FIGS. 28A to 28F and divided in plane are provided at least in either channel region.

In the SOI substrate, the channel impurity region may be formed having different concentration as homogeneous distribution without being divided as a result from a relationship between the condition of thermal diffusion in FIG. 28B and the gap of the resist film in FIG. 28A.

In FIGS. 28A to 28F, the embodiment of so thin SOI substrate as 100 nm has been explained as the semiconductor region. When the thermal diffusion is fully executed, the channel impurity region arrives at the bottom of the silicon thin film. At this time, the threshold voltage is controlled almost by the channel impurity region. That is, when the thickness of the semiconductor region is almost equal to the depth of the channel impurity region, the controllability of the threshold voltage may be enhanced more because the influence of the depletion layer becomes small. Further, the effect may be obtained without thinning the silicon thin film as the semiconductor region to the level of the depth of the channel impurity region.

The threshold voltage control sensitivity may be increased by forming the silicon thin film so as to be at least thinner than the depth of the depletion layer, the channel region, because the influence of the depletion layer becomes small. Generally, a silicon thin film of less than 10 $\mu$m is used in the SOI substrate which differs from the thick semiconductor substrate in the prior art. Although not shown, threshold voltages may be readily controlled in the same manner for a MOSFET having silicon thin films each having different thicknesses. A CMOS type SOI integrated circuit may be also formed in the same manner.

Figure 29:
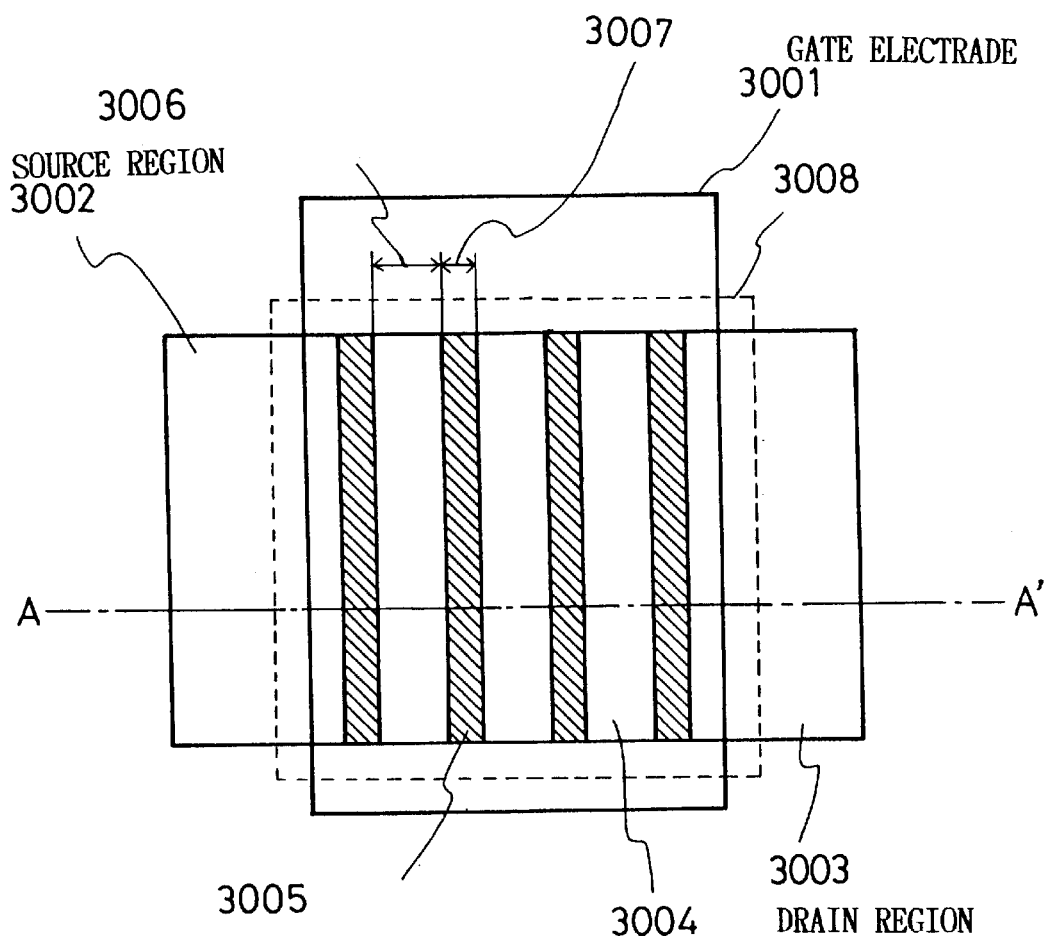
FIG. 29 is a schematic plan view of a MOSFET according to an ninth embodiment of the present invention.
Figure 30:
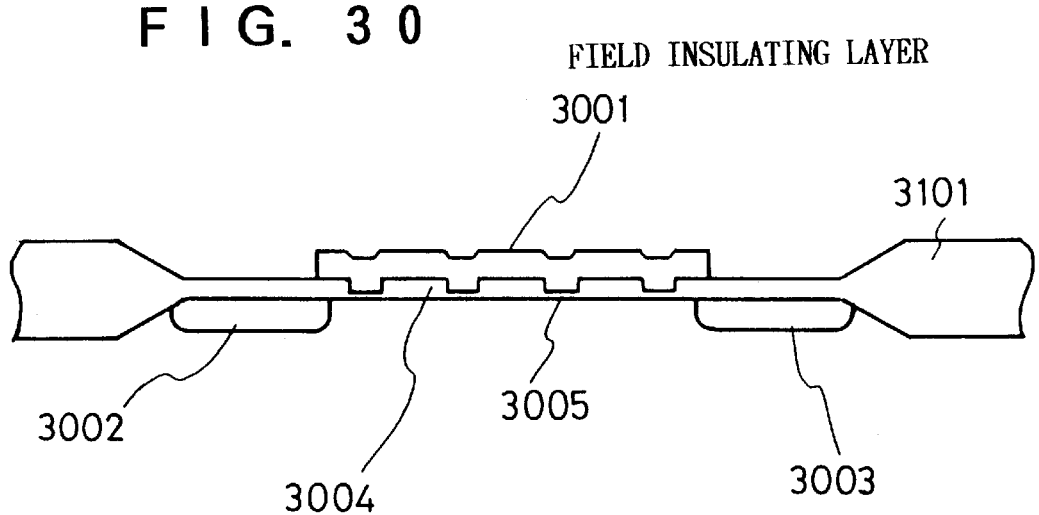
FIG. 30 is a schematic section view of the MOSFET according to the ninth embodiment of the present invention.

FIG. 29 is a schematic plan view of a MOSFET according to an ninth embodiment of the present invention. FIG. 30 is a schematic selection view showing A–A' selection of the MOSFET of the ninth embodiment shown in FIG. 29.

In the figures, gate insulating film regions 3004 having a first thickness and gate insulating film regions 3005 having a second thickness are formed on the same channel region in the MOSFET of the ninth embodiment.

The MOSFET of the ninth embodiment is an N-type MOSFET formed on a P-type semiconductor substrate and the gate insulating film region 3004 having the first thickness is a gate insulating film of the MOSFET which is normally formed by polysilicon of the first layer (sub-layer) and has a thickness of about 60 nm.

The gate insulating film region 3005 having the second thickness is substituted by a tunnel insulating film for injecting or pulling out charges to/from a floating gate of a FLOTOX type non-volatile memory and has a thickness of about 10 nm.

Normally an N-type impurity diffusion layer having a relatively high concentration exists under the tunnel insulating film in a FLOTOX type non-volatile memory, the P-type semiconductor substrate exists in the present embodiment.

The gate insulating film regions 3005 having the second thickness substituted by the tunnel insulating film are drawn in strips parallel to the channel width.

In the present embodiment, a thin insulating film for doping impurity is formed before forming the normal gate insulating film and tunnel insulating film and ions of impurity for adjusting threshold voltage are implanted to a channel region selected by photoresist and others optically patterned by a mask pattern for doping impurity through the thin insulating film for doping impurity, so that the surface concentration right under the gate insulating film is constant regardless of the thicknesses of the gate insulating film.

Further, similarly to the manner by which the area ratio of the area having the second impurity concentration is determined in the MOSFET of the first embodiment, an area ratio of the gate insulating film region having the second thickness is determined to a desired value through the combination of a width 3006 of the gate insulating film region having the first thickness and a width 3007 of the gate insulating film region having the second thickness.

Further, the size of the width 3006 of the gate insulating film region having the first thickness and that of the width 3007 of the gate insulating film region having the second thickness may differ even if the area ratio is the same.

Figure 31:
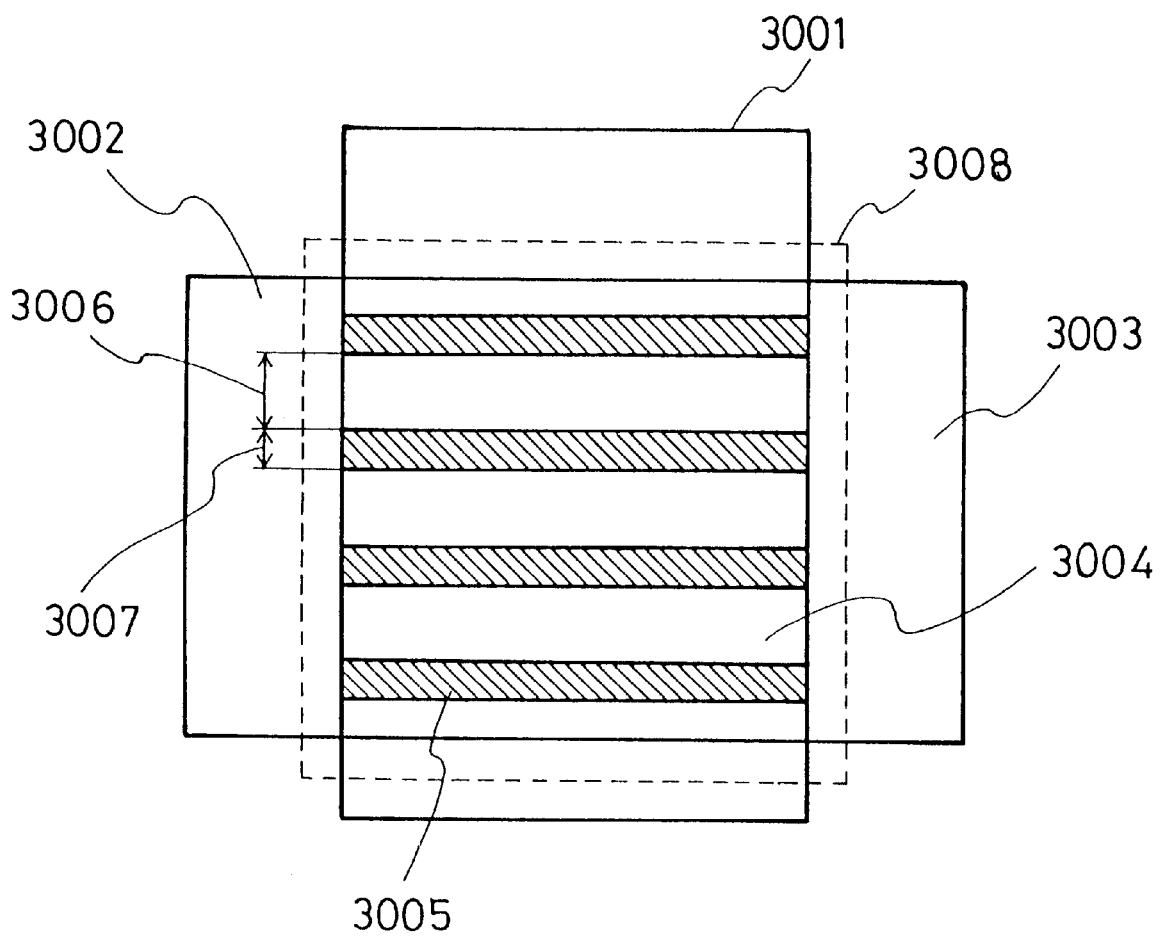
FIG. 31 is a schematic plan view of a MOSFET according to a tenth embodiment of the present invention.

FIG. 31 is a schematic plan view of a MOSFET according to a tenth embodiment of the present invention.

While the gate insulating film regions having the second thickness are drawn in strips similarly to the ninth embodiment, they are drawn in strips in the direction parallel to the channel length in the tenth embodiment. An area ratio of the gate insulating film region having the second thickness is determined to a desired value also in the tenth embodiment. Further, the size of the width 3006 of the gate insulating film region having the first thickness and that of the width 3007 of the gate insulating film region having the second thickness may differ even if the area ratio is the same.

Figure 32:
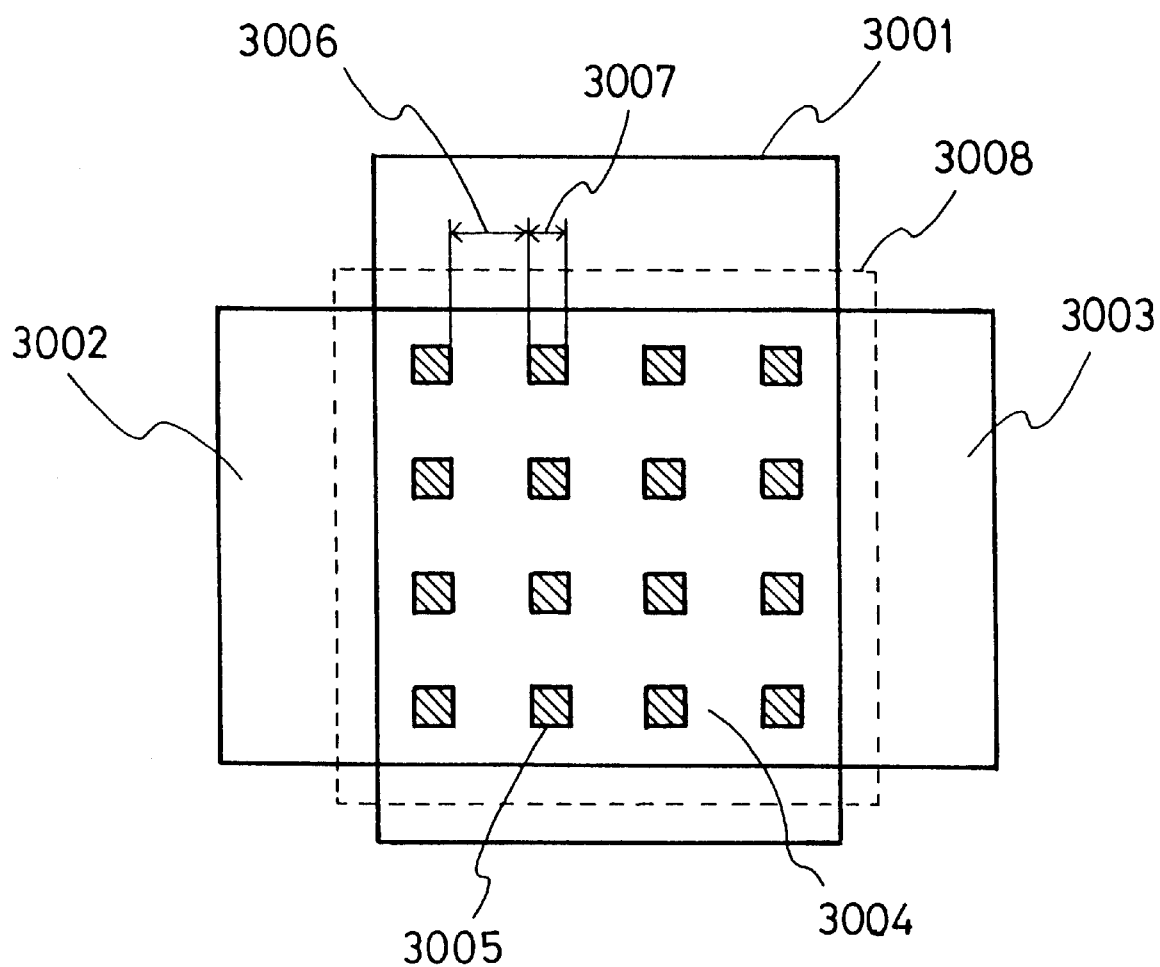
FIG. 32 is a schematic plane view of a MOSFET according to an eleventh embodiment of the present invention.

FIG. 32 is a schematic plan view of a MOSFET according to an eleventh embodiment of the present invention.

In the eleventh embodiment, the gate insulating film regions having the second thickness 3005 exist in dots. An area ratio of the gate insulating film area having the second thickness is determined to a desired value also in the eleventh embodiment similarly to the ninth and tenth embodiments. Further, the size of the width 3006 of the gate insulating film region having the first thickness and that of the width 3007 of the gate insulating film region having the second thickness may differ even if the area ratio is the same.

Figure 33:
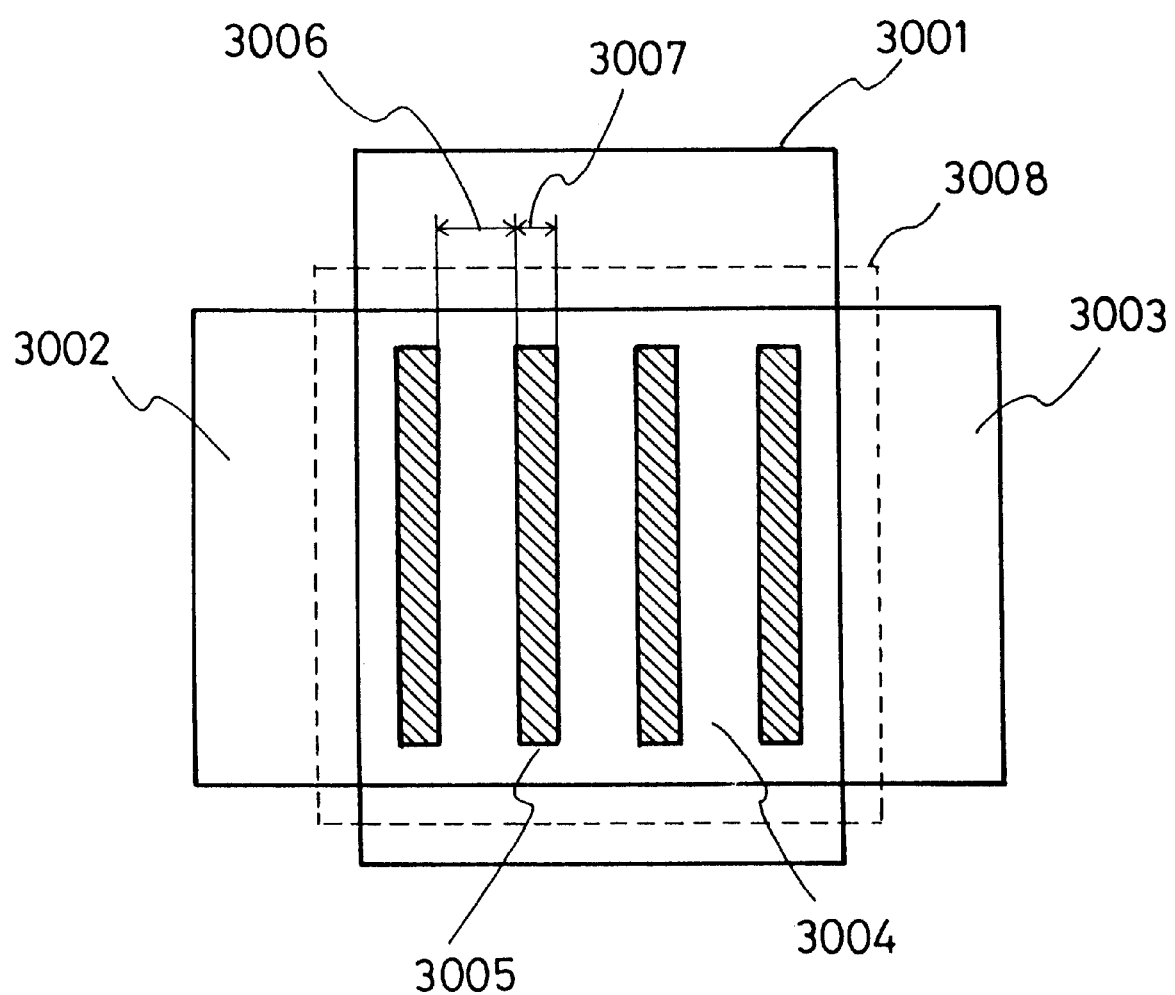
FIG. 33 is a schematic plane view of a MOSFET according to a twelfth embodiment of the present invention.

FIG. 33 is a schematic plan view of a MOSFET according to a twelfth embodiment of the present invention.

The twelfth embodiment is what the ninth embodiment is improved and is arranged so that the gate insulating film regions having the second thickness 3005 are separated from the edge of the field insulating film.

By arranging as such, a leak current to the substrate at the edge of the field insulating film may be reduced when a high electric field is applied to the gate electrode even if the thickness of the gate insulating film regions having the second thickness 3005 is very thin.

Figure 34:
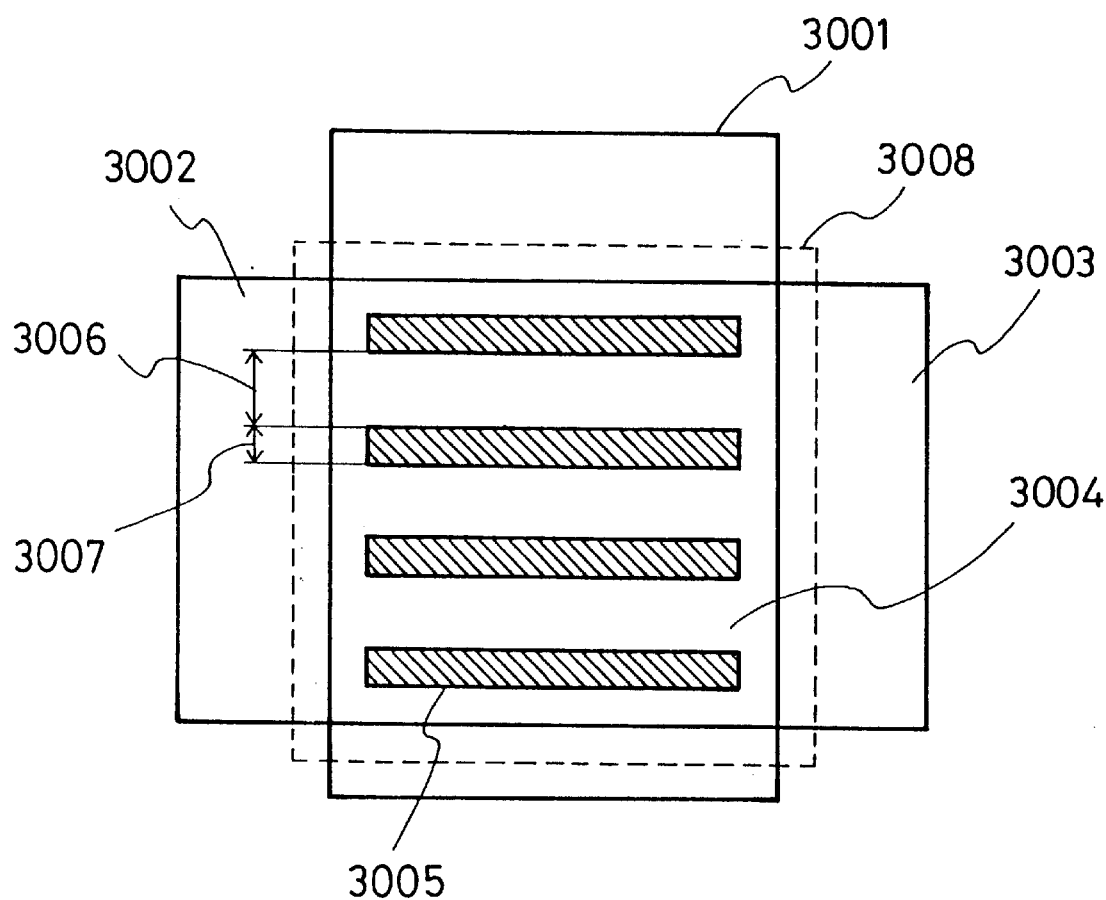
FIG. 34 is a schematic plane view of a MOSFET according to a thirteenth embodiment of the present invention.

FIG. 34 is a schematic plan view of a MOSFET according to a thirteenth embodiment of the present invention.

The thirteenth embodiment is what the tenth embodiment is improved and is arranged so that the gate insulating film regions having the second thickness 3005 are separated from the edge of the source and drain.

By arranging as such, a withstand voltage of the source and drain may be improved even if the thickness of the gate insulating film regions having the second thickness 3005 is very thin.

Figure 35:
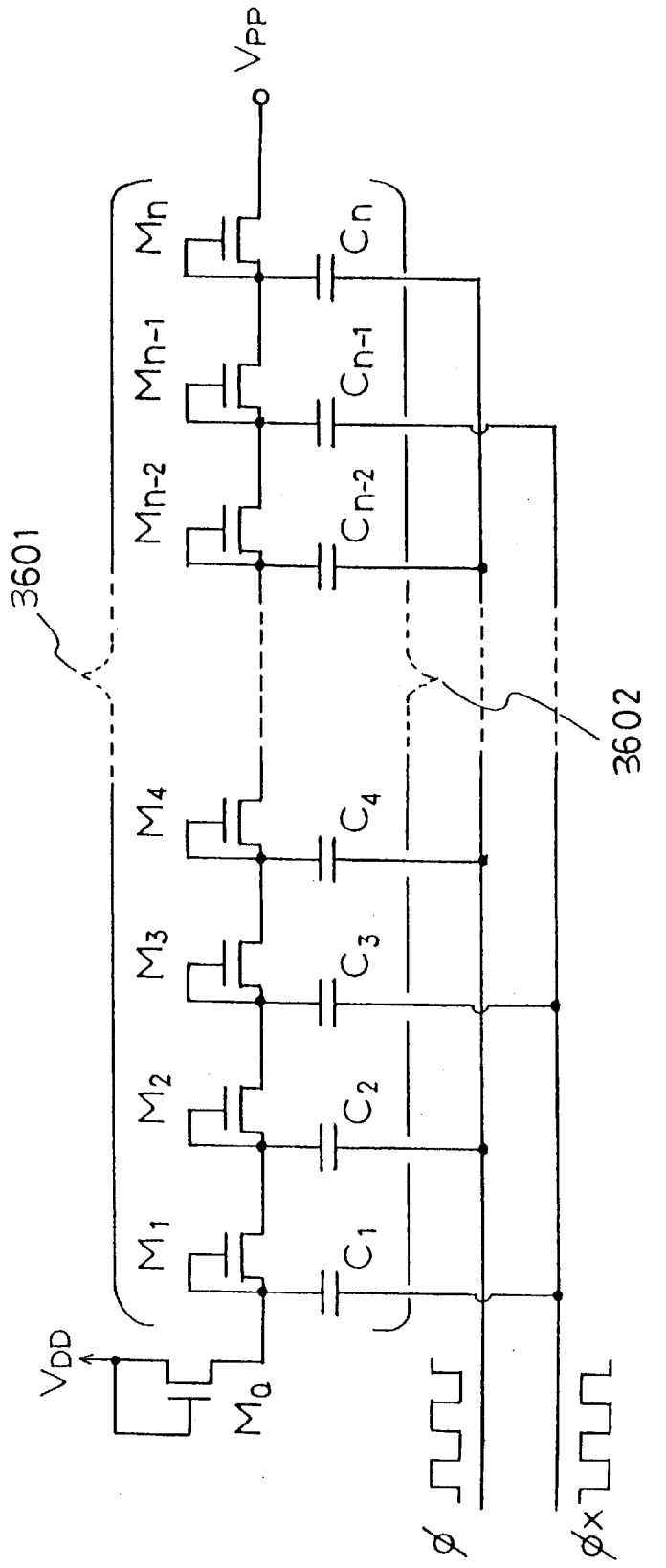
FIG. 35 is a circuit diagram of a voltage boosting circuit according to a fourteenth embodiment of the present invention.

FIG. 35 is a circuit diagram of a voltage boosting circuit (charge pumping circuit) according to a fourteenth embodiment of the present invention.

A plurality of MOS diodes in which a drain electrode and a gate electrode of a MOSFET are connected at the same node is connected in series and a capacitor is connected to each node where MOS diodes are connected. It is structured so that every other signals whose phases are shifted from each other like Φ and Φx are applied alternately to one of electrodes of the capacitor. A VPP which is a voltage boosted and is higher than a power supply voltage VDD is output from a MOS diode Mn by transferring charges sequentially from the capacitor C1 to Cn.

If the MOS diodes M1 though Mn all have the same threshold voltage, a drop of a source terminal voltage to a drain terminal voltage becomes large gradually since the later the step, the higher a substantial threshold voltage becomes due to a body effect. That is, the efficiency of the charge pump circuit becomes worse in the later step.

Then, in the present embodiment, an area ratio of the region having the second impurity concentration in the channel region of the MOS diodes M1 through Mn is changed from each other to lower the threshold voltage in the later step.

Actually, transistors in which the impurity concentration of the channel is in the native state (threshold voltage is about 0.00 V in the present embodiment) are used in the preceding steps and the depletion state is deepened in the later steps, i.e. the state of normally-on is enhanced. However, because the threshold voltage is increased more due to the body effect in the later MOS diodes, the substantial threshold voltage is near 0 V in any MOS diodes as a result and the drop of the source terminal voltage to the drain terminal voltage in each step is suppressed low, enhancing the efficiency of the voltage boosting circuit to a great deal. The threshold voltages of the MOS diodes may be changed per several steps by dividing into several blocks, not differentiating the threshold voltages of all the MOS diodes.

Further, the same effect may be obtained even when the threshold voltages are changed by changing the area ratio of the second gate insulating film region.

FIG. 36 is a simplified block diagram of a non-volatile semiconductor memory device mounted with the voltage boosting circuit according to a fifteenth embodiment of the present invention.

By being mounted with the high efficient voltage boosting circuit as such, a non-volatile semiconductor memory device which allows to write and erase data electrically even in a very low voltage range of about 0.7 V to 1.0 V.

Figure 37:
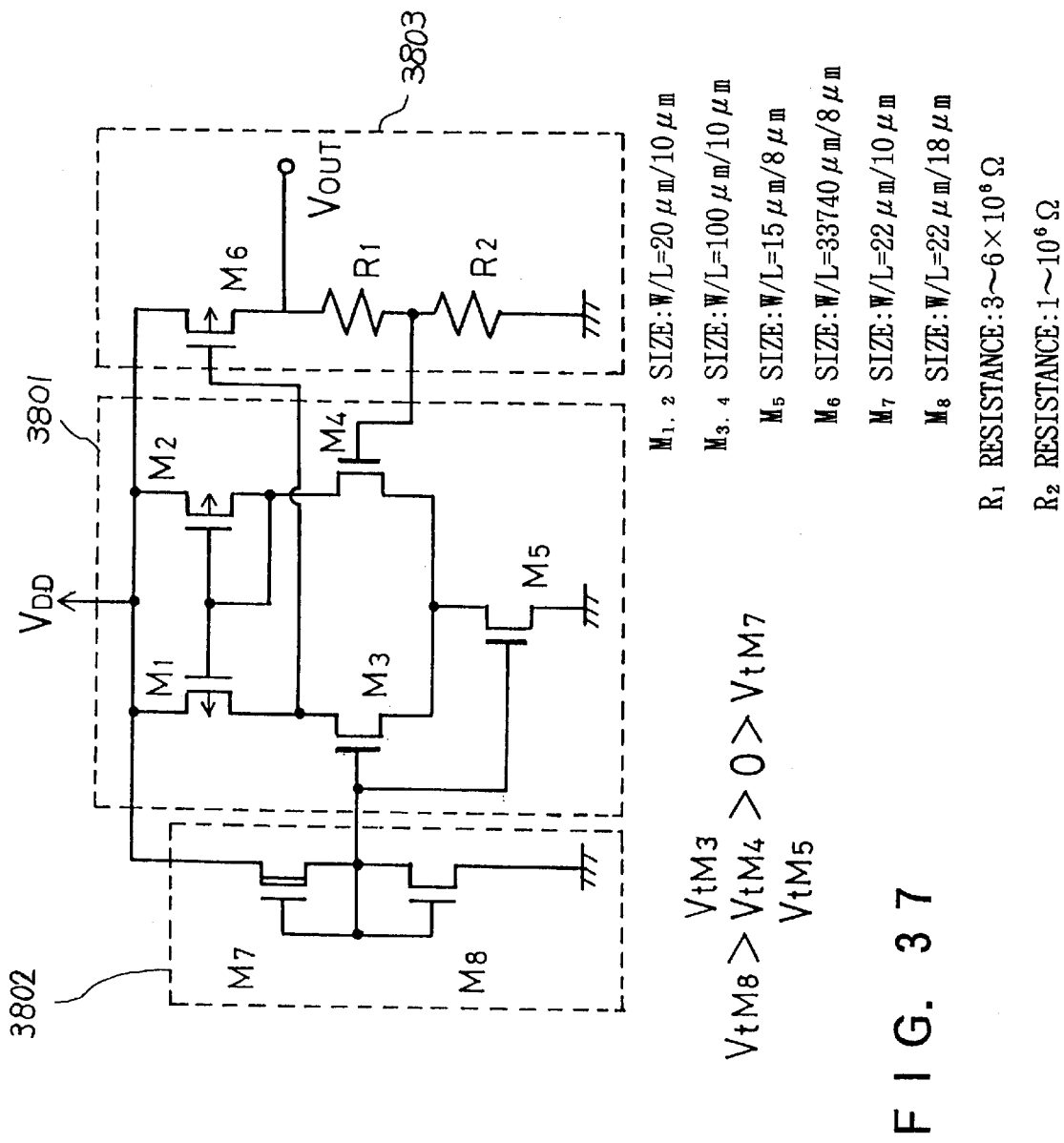
FIG. 37 is a circuit diagram of a constant voltage output circuit having a differential amplifier circuit according to a sixteenth embodiment of the present invention.
Figure 38:
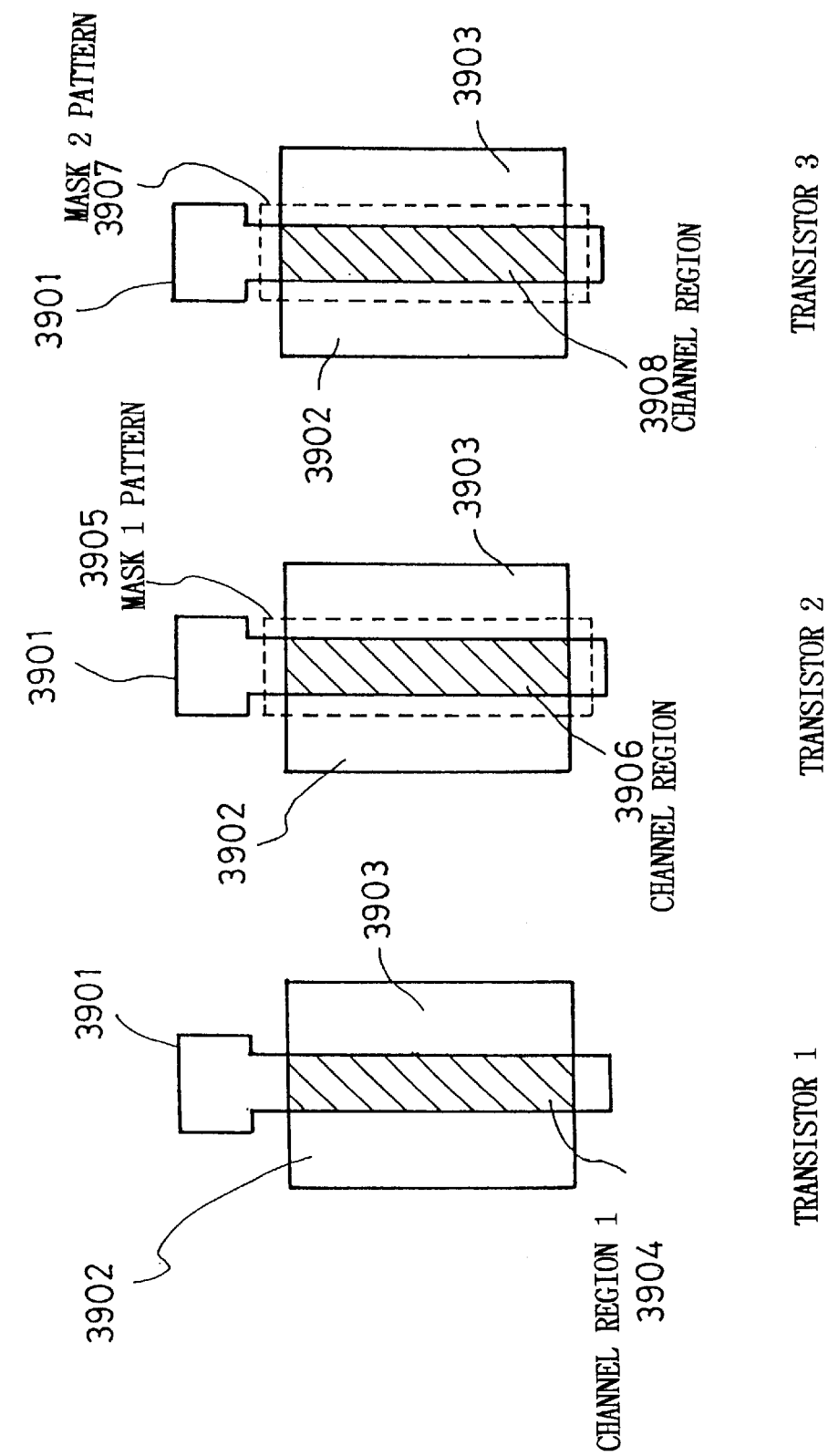
FIGS. 38A to 38C are schematic plan views of a MOSFET according to a prior art technology.
Figure 39:
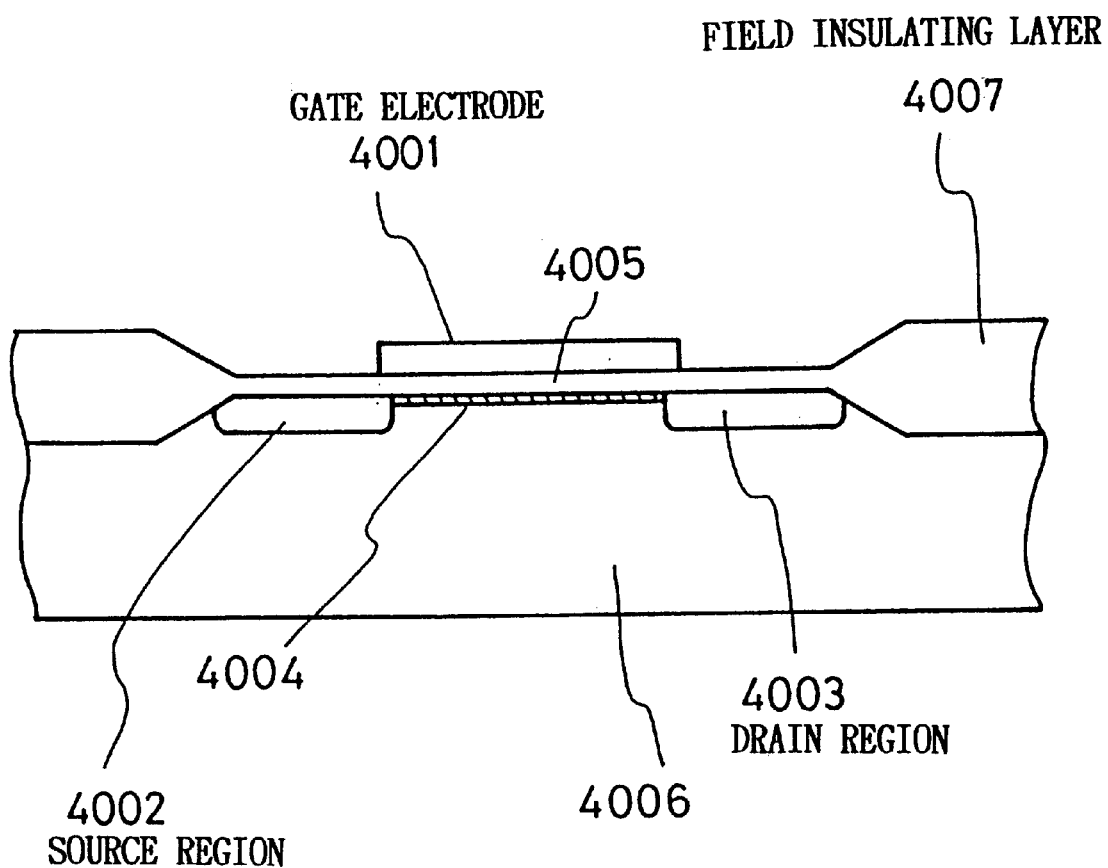
FIG. 39 is a schematic section view of the MOSFET according to the prior art technology.

FIG. 37 is a circuit diagram of a constant voltage output circuit having a differential amplifier circuit according to a sixteenth embodiment of the present invention.

It is constructed so as to always output a constant voltage from an output terminal VOUT even if a load of the output is changed by comparing a criterion constant voltage generated in a reference voltage generating circuit section 3802 with the voltage output to outside by an output circuit section 3803 by comparing voltages whose resistance is divided by resistors R1 and R2 by the differential amplifier circuit section 3801.

In the present embodiment, enhancement type NMOS transistors M3, M4 and M5 having a relatively low threshold voltage (about 0.34 V) are used in the differential amplifier circuit section 3801 to prevent the NMOS transistor M3 from cutting off during operation in a low voltage due to the increase of threshold voltage caused by the body effect of the transistor M3.

Further, an enhancement type NMOS transistor M8 having a relatively high threshold voltage (about 0.50 V) is used in the reference voltage generating circuit section 3802 to stabilize the reference voltage value by suppressing a leak current of the transistor M8 in high temperature.

Also a depletion type NMOS transistor M7 (Vth=−0.40 V) is used in the reference voltage generating circuit section 3802; i.e. three kinds of threshold voltages of the NMOS transistors exist in total in the whole present embodiment.

Although three times of different impurity doping processes have been necessary to manufacture the transistors having such three kinds of threshold voltages in the prior art, those transistors may be manufactured by two times or one time of impurity doping process by adjusting the region having the second impurity concentration to have an adequate shape and area ratio.

The present invention has the following effects that the semiconductor device may be simply manufactured by providing a plurality of surface inversion voltage regions as a result by providing a plurality of impurity concentration regions or a gate insulating film region having a plurality of thicknesses in plane in the channel region of the same MOSFET and by setting a plurality of ratios between a plane area of a first surface inversion voltage regions and that of a second surface inversion voltage region and thereafter or setting a plurality of plane sizes or shapes of the first surface inversion voltage regions and second surface inversion voltage regions and thereafter even if the area ratio is the same:

(1) MOSFETs having a large number of kinds of threshold voltages on the same substrate may be formed at low cost;

(2) A high withstand voltage MOSFET and a low voltage MOSFET having almost the same level of threshold voltages may be formed at low cost;

(3) An N-type MOSFET and a P-type MOSFET having almost the same level of threshold voltages may be formed at low cost; and (4) A high performance semiconductor integrated circuit device may be manufactured at low cost by carrying the MOSFETs in (1) through (3) described above.

What is claimed is:

1. A semiconductor device comprising: a semiconductor substrate having a first conductivity type; an insulating layer formed on the semiconductor substrate; a gate electrode formed in contact with the insulating layer; and a MIS element formed in a surface of the semiconductor substrate under the gate electrode; wherein the surface of the semiconductor substrate has a first inversion voltage region which is inverted to a second conductivity type by a first gate voltage and a second inversion voltage region which is inverted to the second conductivity type by a second gate voltage, the first inversion voltage region and the second inversion voltage region each comprise a plurality of first channel impurity concentration regions having first channel impurity concentration and second channel impurity concentration regions having a second impurity concentration formed on said surface of the semiconductor substrate in contact with the insulating layer right under the gate electrode; and further comprising enhancement mode and depletion mode MISFETs of the second conductivity type formed on the surface of the first conductivity type semiconductor substrate; a first conductivity type impurity region having a concentration denser than the semiconductor substrate formed on a channel region of an enhancement mode MISFET; and a second conductivity type impurity region formed in a channel region of a depletion mode MISFET, the second conductivity type impurity region having substantially the same impurity profile as the first conductivity type impurity region of the enhancement mode MISFET and having a concentration denser than the first conductivity type impurity region; wherein a position of a peak impurity concentration of the second conductivity type impurity region is at a location within ±20 nm from a peak impurity concentration of the first conductivity type impurity region, the first channel impurity concentration region has the first conductivity type impurity region, and the second channel impurity concentration region has the second conductivity type impurity region.

2. A semiconductor device comprising: a semiconductor substrate having a first conductivity type; and a plurality of groups of MISFETs forming a circuit, the MISFETs of each group having a different threshold voltage and saturation current value from the MISFETs of the other groups, each MISFET comprising an insulating layer formed on the semiconductor substrate, a gate electrode formed on the insulating layer, second conductivity type source and drain regions formed spaced apart from each other in the semiconductor substrate, and a channel region formed in the semiconductor substrate beneath the gate electrode and between the source and drain regions; wherein a portion of the surface of the semiconductor substrate in the channel region under the gate electrode of the MISFETs of one or more of the groups of MISFETs is divided plane-wise into at least a first inversion voltage region which is inverted to a second conductivity type by application of a first gate voltage and a second inversion voltage region which is inverted to the second conductivity type by application of a second gate voltage, and the second inversion voltage region is divided plane-wise into two or more segments each having a planar shape different from that of the first inversion voltage region and each being inverted to the second conductivity type by application of the second gate voltage; wherein the plural groups of MISFETs comprise a first group of MISFETs each having a channel region divided into the first and second inversion voltage regions, a second group of MISFETs each having a channel region comprising only the first inversion voltage region, and a third group of MISFETs each having a channel region comprising only the second inversion voltage region; wherein each MISFET further comprises a first conductivity type impurity profile region having a higher impurity concentration than that of the first conductivity type semiconductor substrate to serve as an enhancement type channel region; and a second conductivity type impurity profile region having an impurity profile that is substantially the same as that of the enhancement type channel region and having a higher impurity concentration than that of the first conductivity type impurity profile region to serve as a depletion type channel region; and wherein a peak location of the second conductivity type impurity profile is in the range of ±20 nm from a peak location of the first conductivity type impurity profile.

3. A semiconductor device according to claim 2; wherein at least the second inversion voltage region of a plurality of the MISFETs is divided into five or more plane shapes.

4. A semiconductor device according to claim 2; wherein the second inversion voltage region is divided into a plurality of spaced-apart segments, each segment having a planar shape comprising a strip extending parallel to a longitudinal direction of the channel region between the source and drain regions.

5. A semiconductor device according to claim 2; wherein the first inversion voltage region and the second inversion voltage region respectively comprise a first impurity concentration region and a second impurity concentration region formed in the channel region of the semiconductor substrate so as to contact the insulating layer directly under the gate electrode.

6. A semiconductor device according to claim 2; wherein at least one of the first impurity concentration region and the second impurity concentration region has a shallower junction depth than that of the source and drain regions.

7. A semiconductor device according to claim 2; wherein the one or more MISFETs of the first group are N-channel type MISFETS.

8. A semiconductor device according to claim 7; wherein a surface inversion voltage (threshold voltage) of the first inversion voltage region of the N-channel type MISFETs is in the range of −0.01 to 0.3V and a surface inversion voltage (threshold voltage) of the second inversion voltage region is in the range of −0.01 to −1.0V.

9. A semiconductor device according to claim 7; wherein a surface inversion voltage (threshold voltage) of the N-channel type MISFETs is in the range of −0.01 to 0.3V and a surface inversion voltage (threshold voltage) of the second inversion voltage region is in the range of −0.3 to 5.0V.

10. Semiconductor device according to claim 7; wherein a surface inversion voltage (threshold voltage) of the first inversion voltage region of the N-channel type MISFETs is in the range of 0.3 to 5.0V and a surface inversion voltage (threshold voltage) of the second inversion voltage region is in the range of −0.01 to −1.0V.

11. A semiconductor device according to claim 2; wherein the one or more MISFETs of the first group are P-channel type MISFETs.

12. A semiconductor device according to claim 11; wherein a surface inversion voltage (threshold voltage) of the first inversion voltage region of the P-channel type MISFETs is in the range of 0.01 to −0.3V and a surface inversion voltage (threshold voltage) of the second inversion voltage region is in the range of 0.01 to 1.0V.

13. A semiconductor device according to claim 11; wherein a surface inversion voltage (threshold voltage) of the first inversion voltage region of the P-channel type MISFETs is in the range of 0.01 to −0.3V and a surface inversion voltage (threshold voltage) of the second inversion voltage region is in the range of −0.3 to −5.0V.

14. A semiconductor device according to claim 11; wherein a surface inversion voltage of the first inversion voltage region of the P-channel type MISFETs is in the range of −0.3 to −5.0V and a surface inversion voltage (threshold voltage) of the second inversion voltage region is in the range of 0.01 to 1.0V.

15. A semiconductor device comprising: a semiconductor substrate having a first conductivity type; and a plurality of groups of MISFETs, the MISFETs of each group having a different threshold voltage and saturation current value from the MISFETs of the other groups, each MISFET comprising an insulating layer formed on the semiconductor substrate, a gate electrode formed on the insulating layer, second conductivity type source and drain regions formed spaced apart from each other in the semiconductor substrate, and a channel region formed in the semiconductor substrate beneath the gate electrode and between the source and drain regions; wherein a portion of the surface of the semiconductor substrate in the channel region under the gate electrode of the MISFETs of one or more of the groups of MISFETs is divided plane-wise into at least a first inversion voltage region which is inverted to a second conductivity type by application of a first gate voltage and a second inversion voltage region which is inverted to the second conductivity type by application of a second gate voltage, and the second inversion voltage region is divided into two or more segments separated from each other by a portion of the first inversion voltage region; wherein the plural groups of MISFETs comprise a first group of MISFETs each having a channel region comprising only the first inversion voltage region, a second group of MISFETs having a channel region comprising only the second inversion voltage region and third and fourth groups of MISFETs each having a channel region divided into the first and second inversion voltage regions, the third and fourth groups having a different area ratio between the first and second inversion voltage regions; wherein each MISFET further comprises a first conductivity type impurity profile region having a higher impurity concentration than that of the first conductivity type semiconductor substrate to serve as an enhancement type channel region; and a second conductivity type impurity profile region having an impurity profile that is substantially the same as that of the enhancement type channel region and having a higher impurity concentration than that of the first conductivity type impurity profile region to serve as a depletion type channel region; and wherein a peak location of the second conductivity type impurity profile is in the range of ±20 nm from a peak location of the first conductivity type impurity profile.

16. A semiconductor device according to claim 15; wherein at least the second inversion voltage region of a plurality of the MISFETs is divided into five or more plane shapes.

17. A semiconductor device according to claim 15; wherein at least the second inversion voltage region of a plurality of the MISFETs is divided into a plurality of spaced-apart segments, each segment having a planar shape comprising a strip extending parallel to a longitudinal direction of the channel region between the source and drain regions.

18. A semiconductor device according to claim 15; wherein the first inversion voltage region and the second inversion voltage region respectively comprise a first impurity concentration region and a second impurity concentration region formed in the channel region of the semiconductor substrate so as to contact with the insulating layer directly under the gate electrode.

19. A semiconductor device according to claim 15; wherein at least one of the first impurity concentration region and the second impurity concentration region has a shallower junction depth than that of the source and drain regions.

20. A semiconductor device according to claim 15; wherein the one or more MISFETs of the first group are N-channel type MISFETs.

21. A semiconductor device according to claim 20; wherein a surface inversion voltage (threshold voltage) of the first inversion voltage region of the N-channel type MISFETs is in the range of −0.01 to 0.3V and a surface inversion voltage (threshold voltage) of the second inversion voltage region is in the range of −0.01 to −1.0V.

22. A semiconductor device according to claim 20; wherein a surface inversion voltage (threshold voltage) of the N-channel type MISFETs is in the range of −0.01 to 0.3V and a surface inversion voltage (threshold voltage) of the second inversion voltage region is in the range of −0.3 to 5.0V.

23. Semiconductor device according to claim 20; wherein a surface inversion voltage (threshold voltage) of the first inversion voltage region of the N-channel type MISFETs is in the range of 0.3 to 5.0V and a surface inversion voltage (threshold voltage) of the second inversion voltage region is in the range of −0.01 to −1.0V.

24. A semiconductor device according to claim 15; wherein each of the MISFETs of the first group are P-channel type MISFETs.

25. A semiconductor device according to claim 24; wherein a surface inversion voltage (threshold voltage) of the first inversion voltage region of the P-channel type MISFETs is in the range of 0.01 to −0.3V and a surface inversion voltage (threshold voltage) of the second inversion voltage region is in the range of 0.01 to 1.0V.

26. A semiconductor device according to claim 24; wherein a surface inversion voltage (threshold voltage) of the first inversion voltage region of the P-channel type MISFETs is in the range of 0.01 to −0.3V and a surface inversion voltage (threshold voltage) of the second inversion voltage region is in the range of −0.3 to −5.0V.

27. A semiconductor device according to claim 23; wherein a surface inversion voltage of the first inversion voltage region of the P-channel type MISFETs is in the range of −0.3 to −5.0V and a surface inversion voltage (threshold voltage) of the second inversion voltage region is in the range of 0.01 to 1.0V.

28. A semiconductor device having enhancement and depletion type second conductivity type MISFETS, comprising: a semiconductor substrate having a first conductivity type semiconductor region; a first conductivity type impurity profile region having a higher impurity concentration than that of the first conductivity type semiconductor region to serve as an enhancement type channel region; and a second conductivity type impurity profile region having an impurity profile that is substantially the same as that of the enhancement type channel region and having a higher impurity concentration than that of the first conductivity type impurity profile to serve as a depletion type channel region; wherein a peak location of the second conductivity type impurity profile is within the range of ±20 nm from a peak location of the first conductivity type impurity profile.

* * * * *